United States Patent
Tanabe et al.

[11] Patent Number: 5,964,942
[45] Date of Patent: Oct. 12, 1999

[54] WAFER AND METHOD OF PRODUCING SAME

[75] Inventors: Keiichiro Tanabe; Yuichiro Seki; Akihiko Ikegaya; Naoji Fujimori; Takashi Tsuno, all of Itami, Japan

[73] Assignee: Sumitomo Electric Industries, Ltd., Osaka, Japan

[21] Appl. No.: 08/494,719

[22] Filed: Jun. 26, 1995

[30]     Foreign Application Priority Data

Jun. 24, 1994 [JP] Japan .................................. 6-165915

[51] Int. Cl.$^6$ .................................................. C30B 29/04
[52] U.S. Cl. ........................... 117/87; 117/104; 117/105; 117/929; 427/577; 423/446
[58] Field of Search ............................. 177/929, 87, 104, 177/105; 427/577; 423/446

[56]     References Cited

U.S. PATENT DOCUMENTS

| | | | |
|---|---|---|---|
| 4,849,199 | 7/1989 | Pinneo | 117/929 |
| 4,863,529 | 9/1989 | Imai et al. | 143/334 |
| 5,114,745 | 5/1992 | Jones | 117/929 |
| 5,387,310 | 2/1995 | Shiomi et al. | 117/101 |
| 5,635,258 | 6/1997 | Chen et al. | 427/577 |
| 5,648,119 | 7/1997 | Grab et al. | 427/249 |
| 5,755,879 | 5/1998 | Shintani et al. | 117/929 |
| 5,776,246 | 7/1998 | Tanabe et al. | 117/89 |
| 5,807,432 | 9/1998 | Hirabayashi | 117/87 |

FOREIGN PATENT DOCUMENTS

| | | |
|---|---|---|
| 386726 | 9/1990 | European Pat. Off. . |
| 551730 | 7/1993 | European Pat. Off. . |
| 560287 | 9/1993 | European Pat. Off. . |
| 63-224225 | 9/1988 | Japan . |
| 2-233591 | 9/1990 | Japan . |
| 4-132687 | 5/1992 | Japan .................................. 131/42.2 |

OTHER PUBLICATIONS

Patent Abstracts of Japan, vol. 16, No. 400 (C–977), Aug. 1992, re JP 04–132687.

*Primary Examiner*—Robert Kunemund
*Attorney, Agent, or Firm*—Pillsbury Madison & Sutro LLP

[57]     ABSTRACT

No wide bulk diamond wafer exists at present. A wide diamond-coated wafer is proposed instead of the bulk diamond wafer. Diamond is heteroepitaxially deposited on a convex-distorted non-diamond single crystal substrate by a vapor phase deposition method. In an early step, a negative bias is applied to the substrate. In the case of a Si substrate, an intermediate layer of β-SiC is first deposited on the Si substrate by supplying a low carbon concentration material gas. Then the carbon concentration is raised for making a diamond film. The convex-distorted wafer is stuck to a holder having a shaft which is capable of inclining to the holder. The wafer is pushed to a turn-table of a polishing machine. The convex diamond wafer can fully be polished by inclining the holder to the shaft. A wide distorted mirror wafer of diamond is produced. Fine wire patterns can be made on the diamond mirror wafer by the photolithography.

57 Claims, 15 Drawing Sheets convex-distortion $\Delta H < 0$ wavy wafer

WAFER AFTER POLISHING

FLAT WAFER unpolished part

WAFER AFTER POLISHING

CONCAVE-DISTORTED WAFER unpolished part

WAFER AFTER POLISHING

CONVEX-DISTORTED WAFER unpolished part

WAFER AFTER POLISHING

PRESENT INVENTION no unpolished part

⟨110⟩ resist
substrate resist
substrate random oriented diamond
substrate single-oriented diamond
random oriented diamond
substrate single-oriented diamond
cavity
substrate scratched part single-oriented diamond
random oriented diamond
substrate

WAFER AND METHOD OF PRODUCING SAME

FIELD OF THE INVENTION

This invention relates to a diamond wafer and a method of producing the diamond wafer. The diamond wafer will be capable of being utilized as a material of surface acoustics wave devices (SAW), thermistors and semiconductor devices, for example, transistors(FETs), diodes, pressure sensors, temperature sensors etc. Otherwise the diamond wafer will be also able to be applied to a material of abrasion-resistant discs, disc-protecting film and X-ray windows. Diamond is favored with high sound velocity which is determined by the ratio of Young's modulus to the density. Therefore, the surface acoustics wave has a very large velocity on diamond. Diamond is deemed a promising material of SAWs which include SAW filters, SAW phase shifters and SAW convolvers.

BACKGROUND OF THE INVENTION

This application claims a priority based on Japanese Patent Application No.6-165915 (165915/94) filed Jun. 24, 1994. Diamond has excellent physical and chemical properties. Current technology, however, cannot make a large diamond crystal yet. The ultra-high pressure synthesis method can produce bulk diamonds which are at large several millimeters in diameter. The diamond granules are too small to make devices thereby. There is no wide diamond crystal which has a wide area and can be safely called a wafer yet. Unfortunately, the Bridgman method, the Czochralski method or any other method cannot pull a thick diamond single crystal up from a melt unlike Si or GaAs. There is no effective method of growing a large diamond single crystal yet. The difficult of making a bulk crystal prevents from producing a bulk diamond wafer.

The use of a material in the electronics devices requires at least one inch diameter of a wafer. Furthermore 2 inch, 3 inch or 5 inch diameter wafers are desired for fabricating electronic devices on them. The applicability to the production line of devices demands less than 1 mm thickness of a wafer. Thus, the application of diamond to the device technology ardently requires a polycrystalline diamond wafer having a diameter of more than 1 inch and a thickness of less than 1 mm.

Further, a single crystal diamond wafer would be more convenient for making electronic devices of high quality. The feasible production of high quality single crystal wafers of Si or GaAs allowed the manufactures to make lots of Si or GaAs devices with stable performance.

Films of diamond can now be produced by a vapor phase synthesis method. The chemical vapor phase method produces a film of diamond on a pertinent substrate by heating the substrate in a reaction chamber, supplying a material gas to the reaction chamber, exciting the material gas, inducing a chemical reaction and depositing the result of the chemical reaction on the substrate. The material gas includes at least hydrogen gas and a hydrocarbon gas. In addition, boron-including gas, or nitrogen-including gas or other impurity gas is also supplied into the reaction chamber for changing the electric property or other properties by the impurity doping.

The chemical vapor deposition method is classified by the ways of exciting the material gas into a heat filament method, a microwave plasma CVD method, a radio-frequency plasma method, a DC plasma CVD method and so forth. Some method enables to make a wide diamond film. The speed of synthesis, however, is not fast. Thus, it is rather difficult to produce a thick diamond film by the method.

Nevertheless, there is not yet such a material as can be called a "diamond wafer" in the true meaning. The present technology Is still incapable of making a polycrystalline diamond wafer. Furthermore, nobody has succeeded in producing a single crystal diamond wafer.

Since no big bulk diamond can be produced yet, it is entirely impossible to make a homogeneous diamond wafer which consists only of diamond. A complex wafer may be produced even by the current technology by depositing a diamond film on a pertinent substrate. Since the diamond film is so thin that the substrate should remain for reinforcing the strength of the film. Thus, the complex wafer would consist of a diamond film and a substrate. If such a complex wafer of diamond were produced, the diamond film would be still polycrystalline. Thus the current technology is distanced far away from a single crystal diamond wafer. The single crystal diamond would be the most useful for all utilities. Since no big diamond bulk single crystal cannot be made at present, it is entirely impossible to make a monocrystalline diamond by homoepitaxy.

Some methods of heteroepitaxy were proposed by Japanese Patent Laying Open No.63-224225 (224225/1988), Japanese Patent laying Open No.2-233591 (233591/1990) and Japanese Patent Laying Open No.4-132687 (132687/1992).

They alleged that diamond single crystal films were heteroepitaxially grown on a SiC substrate, a Si substrate, a nickel substrate or a cobalt substrate.

Electronic devices or abrasion-resistant discs often make use only of a surface of a material. Thus, such a complex wafer may be useful to some extent. There is, however, no complex diamond wafer which is truly applicable for industrial purposes.

PROBLEMS TO BE SOLVED

The reason of the inapplicability arises from the difficulty of polishing of the diamond-coated wafer. A CVD-grown diamond has a rugged surface with microscopic convexes and concaves. The rugged surface should be converted into a mirror surface by polishing. In the case of silicon wafers, mirror wafers are made by polishing as-cut wafers which have been cut from an ingot crystal. Similarly, diamond wafers should be polished in order to make use of the wafer as a material of devices or tools. Nevertheless, diamond coated wafers cannot be polished by the current technology.

Why cannot a diamond-coated wafer be polished? One reason is the hardness of diamond. Diamond is the hardest among all the materials. A flat diamond, however, can be polished by using diamond powder as the polishing medium, by applying a strong force to a diamond object. It takes a long time to polish diamond by diamond powder. The diamond powder eliminates the surface of a diamond object by dissipating itself.

There Is a fatal difficulty in polishing a diamond coated wafer. A polishing is generally done by the steps of affixing a wafer on a bottom of a flat holder, pressing the wafer to a whetting turn-table, rotating the holder around its shaft and revolving the turn-table around the central shaft. The turn-table grinds the bottom surface of the wafer with free whetting powder or fixed whetting powder. Conventional apparatuses use flat holders having a flat bottom. It is reasonable to adopt a flat holder, since the polished object must be flat. In the case of silicon wafers, the machine can perfectly polish 8-inch wafers with the flat holder.

The diamond-coated wafer consisting of a substrate and a diamond film suffers from inherent distortion. The thermal expansion coefficients of diamond is different from that of the substrate. After a diamond film has been made on a substrate at high temperature, the wafer is cooled to room temperature. The big change of temperature causes large thermal distortion. Besides the thermal one, the diamond film has intrinsic stress by itself. The wafers bend into a convex shape, into a concave shape or into a flat shape by the thermal stress and the intrinsic stress according to the condition of making the films.

FIG. 13 to FIG. 16 demonstrate the states of diamond-coated wafers, when they have been polished by an ordinary polishing machine. In the case of a concave-distorted wafer, an unpolished part will be left at the middle part on the wafer, as shown in FIG. 14. Of course, the peripheral part is polished for the concave wafer. The central part has also been polished, because the the wafer is pushed by a strong force. In the case of a convex-deformed wafer, a wide peripheral ring part is left unpolished, which is exhibited by FIG. 15. FIG. 13 shows the case of a flat wafer. Since the wafer is free from the convex-distortion or from the concave-distortion, it would be perfectly able to be polished. The fact, however, is otherwise. A flat wafer has macroscopic waves. Thus, the flat wafer has unpolished parts at random. In any cases, a conventional whetting machine cannot uniformly polish the overall area of a diamond-coated wafer.

A purpose of the present invention is to provide a diamond coated wafer having a single crystal diamond film on the surface.

Another purpose of the present invention is to provide a diamond-coated wafer having a single crystal (100) diamond which has been heteroepitaxially grown on a substrate of another material.

Another purpose of the present invention is to provide a diamond-coated wafer having an intermediate layer of SiC between a diamond film and a substrate.

Further purpose of this invention is to provide a method of producing a single crystal diamond layer on a substrate of another material.

Another purpose of the present invention is to provide a method of producing an SiC intermediate layer between a diamond film and a substrate for strengthening the cohesion of the film.

Another purpose of this invention is to provide a method of polishing a diamond coated wafer without leaving unpolished portions.

Another purpose of the invention is to provide a method of polishing a diamond coated wafer till a roughness of less than Rmax50 nm and Ra20 nm.

SUMMARY OF THE INVENTION

The diamond wafer of the present invention includes a convex-distorted non-diamond substrate and a diamond film heteroepitaxially grown on the substrate. The wafer has a distortion height $\Delta H$ between $-2$ $\mu$m and $-150$ $\mu$m, where "$-$" means a convex distortion on the side of the film. The diamond film has a roughness of less than Rmax50 nm and Ra20 nm. The thickness of the diamond film ranges from 2 $\mu$m to 150 $\mu$m. Preferably the thickness is about 10 $\mu$m to 50 $\mu$m.

The method of the invention includes the steps of preparing a convex-distorted non-diamond single crystal wafer, growing a diamond film heteroepitaxially on the non-diamond substrate by a CVD method having steps of supplying hydrogen gas and hydrocarbon gases on a heated substrate, fixing the wafer on a holder having a shaft which can incline to the holder and polishing the wafer till a roughness of less than Rmax50 nm and Ra20 nm by rotating and inclining the holder on a turn-table of a polishing machine.

The heteroepitaxy of this invention includes the steps of biasing the substrate at a negative voltage at an early stage of growth, supplying a material gas having a higher carbon concentration at an earlier stage and supplying another material gas having a lower carbon concentration at a later stage.

The vapor phase method for synthesizing the diamond film is a filament CVD method, a plasma CVD method, a microwave CVD method, a flame method or so. The preferable pressure is 1 Torr (133 Pa) to 300 Torr (40 kPa).

The material is typically a mixture of hydrogen gas and a hydrocarbon gas in the CVD methods. In general, hydrogen gas and a hydrocarbon gas are adopted to grow diamond in vapor phase. The whole or a part of hydrogen gas can be replaced by rare gas. The hydrocarbon gas can be also replaced by an organic gas or an inorganic gas including carbon atoms. Furthermore, doping of oxygen gas, an organic gas or an inorganic gas including oxygen is also effective to improve the quality of the diamond film.

This invention adopts a convex-distorted substrate and grows a diamond film on the convex-distorted surface. The complex wafer convexly bends on the side of the diamond film. A flat substrate is inappropriate, since the film would not pertinently polished, as shown in FIG. 13. A concave-distorted complex wafer is also inapplicable, since the middle ring region will be left unpolished after polishing.

Only a convex film can be fully and uniformly polished by the machine of the invention. The machine polishes the diamond-coated complex wafer till a roughness of less than Rmax50 nm and Ra20 nm. Thus, a diamond mirror wafer is fabricated. Such a small roughness allows device manufactures to make electrodes, to implant impurities, to diffuse impurities or to etch selectively by the wafer processes.

The advantages of the invention are explained. Bulk diamond crystals are at present made under very high pressure at a high temperature by the ultrahigh pressure synthesizing method. The bulk diamond has poor significance from the practical standpoint of view, since the synthesized diamond bulk crystals are too small to make devices on them.

By contrast, this invention gives a wide diamond wafer of single crystal for the first time. The proposed diamond wafer has a complex structure having an easily obtainable substrate crystal and a diamond film synthesized on the substrate. A complex structure invites distortion in the process of synthesis by the difference of the thermal expansion coefficients. Thus, the complex wafer has been deemed to be insignificant, because it cannot be polished into a mirror wafer by the conventional polishing machine.

This invention, however, employs a crystal which has inherent convex distortion ($\Delta H \leq 0$) as a substrate in order to make a convex distorted diamond film. The convex distorted diamond film can entirely be polished by the polishing machine having a holder which is capable of inclining to the holder shaft. The success of polishing brings about the possibility of making a large area diamond mirror wafer for the first time.

Furthermore the diamond made by this invention is a single crystal, since the diamond has been heteroepitaxially grown on a non-diamond single crystal. The orientation of the diamond can be arbitrarily determined by choosing the orientation of the substrate. Then this invention enables to make diamond single crystals with arbitrary crystallographical orientation. This is a significant invention giving a breakthrough for various applications of diamond to the semiconductor devices.

DETAILED DESCRIPTION OF THE PREFERRED EMBODIMENT

Figure 1:
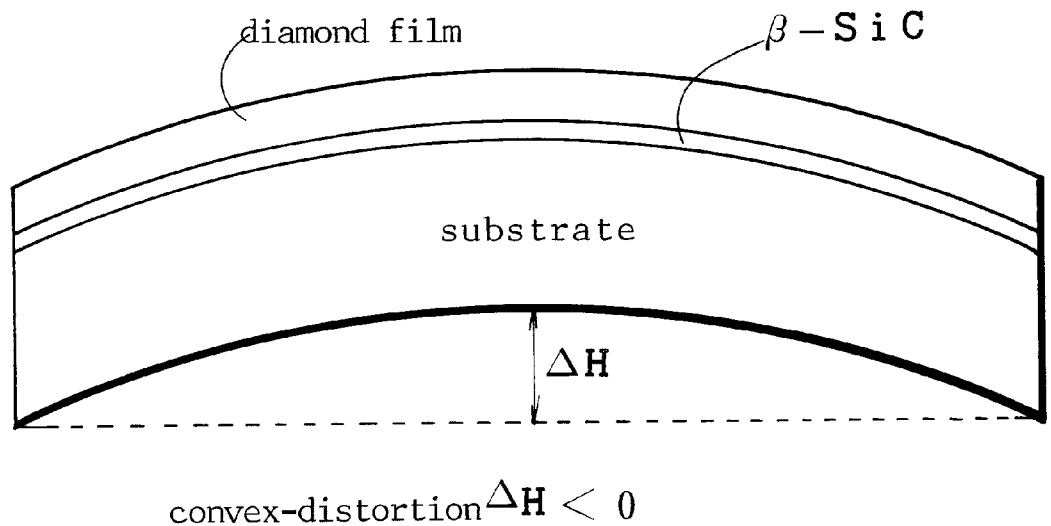
FIG. 1 is a sectional view of a convex diamond wafer having a convex-distorted substrate, an intermediate layer β-SiC on the convex surface of the substrate and a diamond film deposited on the SiC layer.
Figure 2:
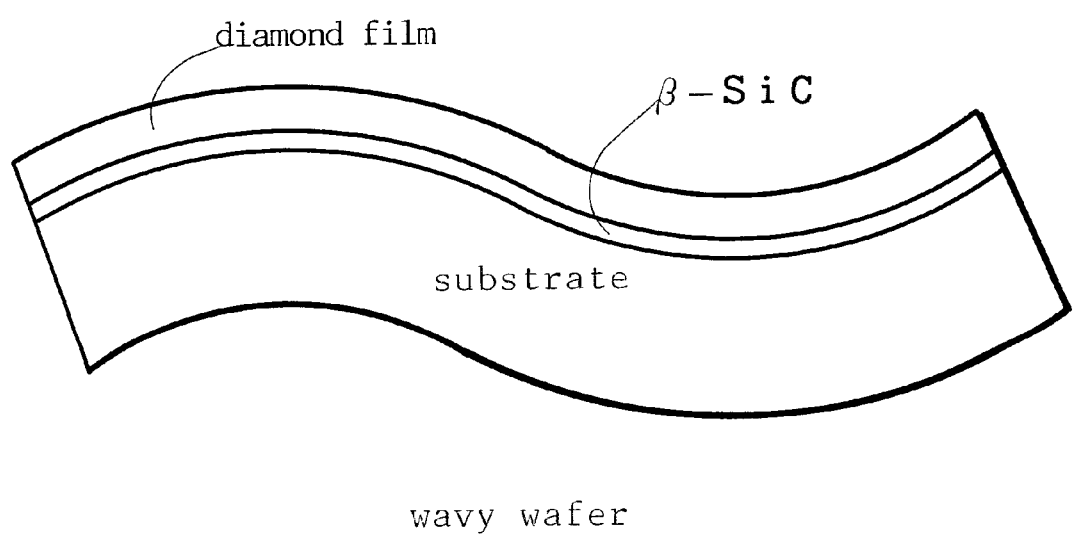
FIG. 2 is a sectional view of a flat diamond wafer having a wavy deformation in macroscopic scale.
Figure 3:
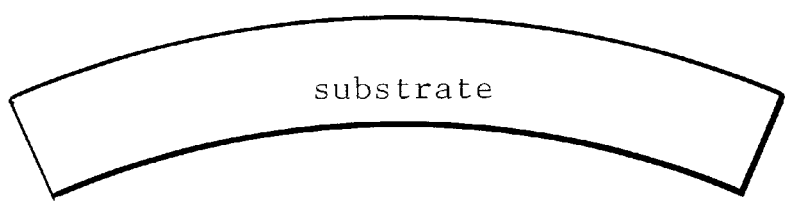
FIG. 3 is a sectional view of an initial convex-distorted substrate.

This invention employs an inherently convex distorted crystal as a substrate on which a diamond film is grown. Due to the inherent distortion, the substrate keeps the convex-distortion with a little change of curvature after the synthesis of the diamond film. The convex distortion is important. The convex-distortion of the complex wafer enables the whetting machine of this invention to polish the diamond film to a desired roughness without unpolished portions. FIG. 1 shows the section of a schematic view of the complex wafer made by this invention. Since this invention deposits a diamond film on a convex-distorted substrate, the diamond coated wafer maintains the convex-distortion which is a suitable shape for being polished by the machine of the invention. There may be various ways for expressing the distortion of wafers. This description represents the distortion by the height ΔH of the central part from the plane including the periphery. A convex distortion takes minus sign for ΔH. A concave distortion takes plus sign for ΔH.

The thermal expansion coefficients may be different between the diamond film and the substrate. The diamond film is sometimes rather thick. Thus, the degree of the distortion may slightly change in the process of formation of the diamond film. In many cases, the distortion of the substrate survives the film deposition. This invention requires the diamond coated film to be distorted in convex shape of a distortion height between 2 μm and 150 μm before polishing. Namely, the preferable pre-polishing distortion ranges from −2 μm to −150 μm. Of course the curvature change due to the formation of the diamond film can be determined by preparatory experiments. Then the range of the suitable inherent distortion of the substrate at the beginning step can easily be calculated from the data of the curvature change and the requirement of the pre-polishing distortion between −2 μm and −150 μm. More suitable range of the distortion of the diamond-coated wafer is from −100 μm to −3 μm. The most preferable distortion ranges from −50 μm to −5 μm. If the distortion ΔH is less than −150 μm (ΔH≦−150 μm), a peripheral ring region will be unpolished in the polishing process. In the distortion H is more than −2 μm (ΔH ≧2 μm), unpolished portions will remain at random like the polishing of a flat wafer.

The substrate for the heteroepitaxy is a Si single crystal, a Ni single crystal, a Cu single crystal, a SiC single crystal and so forth. When a Si single crystal wafer Is adopted as a substrate, it is desirable to grow a β-SiC intermediate layer between the silicon substrate and the diamond film. Then the conditions will again be described with regard to the diamond film, the substrate, the distortion and the reinforcement of the interface in this invention.

A. Diamond Film

The following matters are required for the diamond film.
1. Thickness

2 μm to 150 μm is the suitable thickness of the diamond film. More pertinent thickness ranges from 10 μm to 50 μm for the film coating on a substrate. This invention can make also freestanding films. 20 μm to 800 μm is the range of the optimum thickness for freestanding films. The economical reason restricts the upper limit of the thickness. Of course 1000 μm of thickness is useful from the mechanical or chemical point of view. It takes, however, a long time and much cost to produce such a thick film. On the contrary, too thin a diamond film will cause the difficulty of polishing. Too thin a film (less than 2 μm) induces a break of the wafer or an exposure of the underlying substrate.

2. Roughness After Polishing

The post-polishing roughness should be less than Rmax50 nm and Ra20 nm. If the final roughness of the complex wafer is bigger than Rmax50 nm and Ra20 nm, the wafers cannot be utilized as wafers for devices or wafers for abrasion-resistant tools.

3. Single Crystal

This is an important requirement. This invention enables the diamond film to be grown heteroepitaxially into a single crystal on a single crystal non-diamond substrate by a contrivance of the growing conditions.

B. Substrate
1. Material

A Cu single crystal, a Ni single crystal, a SiC single crystal or a Si single crystal can be employed as a substrate of growing a diamond single crystal film heteroepitaxially. It is effective to apply a bias voltage on the substrate for facilitating the nucleus generation on the substrate.

2. Orientation

In the case of silicon wafers, this invention enables a (100) silicon wafer to make a (100) diamond film despite the difference of the lattice constant. Similarly, a (110) silicon wafer can be produced a (110) diamond single crystal. A (111) silicon wafer can make a (111) diamond single crystal heteroepitaxially.

3. Thickness

A pertinent thickness of the substrate is 0.1 mm to 1 mm. Too thin a substrate forbids polishing of the diamond film on the substrate. A thickness more than 1 mm prevents the complex wafer from being treated by the wafer process. Such a thick wafer is inconvenient for the wafer of producing devices.

4. Shape

A circular wafer is appropriate for carrying out the wafer process. Conventional apparatuses for silicon devices have been designed for treating with circular silicon wafers in the various steps of the wafer process. Round diamond wafers will be able to be treated by the similar apparatuses which have been fully matured in the silicon device technology. An orientation flat (OF) or an index flat (IF) may be cut on a periphery of a circular wafer in order to indicate the orientation of the diamond crystal. Of course, a rectangular substrate or a square substrate is also available for growing diamond heteroepitaxially and for polishing according to the teaching of this invention.

C. Distortion

This invention uses such a substrate having distortion. A flat substrate is useless for this invention. For the reason, this invention cannot divert the Si wafers which are produced for the silicon device industries, because the wafers are sufficiently flat. In this invention, the distortion of the starting substrate is not defined. The distortion ΔH of the pre-polishing wafer is determined to be −2 μm to −150 μm (−150 μm≦ΔH≦−2 μm). Preferably −100 μm≦ΔH≦−3 μm before the polishing. The optimum range is −50 μm≦ΔH≦−5 μm.

D: Reinforcement of Interface

The preferable shapes of the wafer before polishing have been clarified for facilitating polishing till now. Then another problem is contrivances of the film itself and the interface between the film and the substrate for ensuring good performance of the wafer during the polishing process.

When a diamond film on a substrate is whetted, strong force acts on the interface between the film and the substrate. In polishing, peeling of films or chipping of wafers becomes a serious problem. The homogeneous diamond grown epitaxially often betrays poor junction force. The shortage of the coupling force sometimes invites the exfoliation of films or chipping in the homogeneous epitaxial wafer. In particular, this invention aims at the suppression of peeling of the film during polishing. Some contrivances will be proposed to enhance the strength of the interface.

One improvement of reinforcing the interface is a formation of an alien material layer at the interface. In many cases, the substrate material is a monoelement semiconductor e.g., Si, Ge, or a compound semiconductor e.g., GaAs, InP etc. The substrate has a bigger lattice constant than diamond. The alien material should have a lattice constant bigger than diamond. The alien material should have carbon as a component. Thus, SiC is one of the suitable materials for the alien material for forming a intermediate layer for reinforcing the interface.

The Inventors found another way of strengthening the interface. Doping of nitrogen raises the junction force of the interface in the diamond coated wafer. This is a novel knowledge. A nitrogen atom has five outer-shell electrons. Since a carbon atom has only four electrons, a nitrogen atom will have an extra electron in diamond lattice. The extra electron will make a new chemical bond between the nitrogen and the substrate atom. The extra bond will reinforce the interface. Doping of nitrogen of more than 0.1 ppm is effective for improving the resistance against exfoliation. High doping of nitrogen degrades the quality of diamond film. The suitable scope of nitrogen doping ranges from 0.1 ppm to 1000 ppm. Preferably, 1 ppm to 100 ppm of nitrogen doping is effective without abasing the quality.

Another means is an introduction of microscopic irregularities. The development of cracks can be impeded by introducing random-oriented diamond grains. The junction is reinforced by bruising parts of substrate. The random-oriented diamond can be grown by bruising the substrate. The ragged surface prevents diamond from growing in orientation-aligning to the substrate. Thus, the diamond will be random oriented on the ragged parts. 1% of the random-oriented diamond is effective to enhance the interface. The strength of the interface increases in proportion to the ratio of the random-oriented diamond. The single-oriented diamond having the same orientation as the substrate is, however, superior in transparency or electronic properties. Thus partial formation of the random-oriented diamond is preferable. A suitable ratio of the random-orientated diamond to the substrate is between 0.1% and 50% in area.

Figure 22:
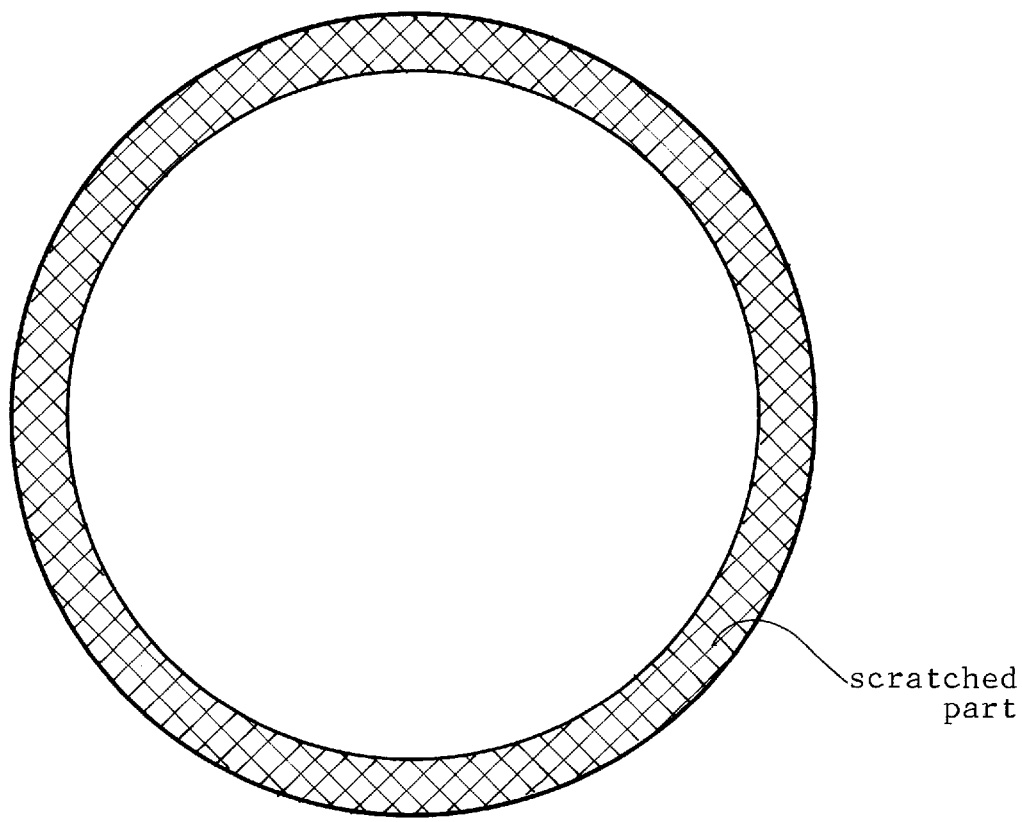
FIG. 22 is a plan view of a circular substrate in which a ring periphery region is scratched.

There is further a problem of distributing the random-oriented diamond. One choice is making the random-oriented diamond at the periphery, as shown in FIG. 22. The peripheral polycrystalline diamond reinforces the sticking force of the film.

Another choice is periodic anomalies. When ICs are fabricated on a substrate, periodic patterns are depicted on the wafer. Thus the arrangement of ICs determines the preferable periodicity of the single-oriented diamond films. Further it is desirable to allot random-oriented diamond to the line of slicing. In this case, the random-oriented diamond is not an obstacle for the devices fabricated on it. An area of a unit of the single-oriented diamond which has the same orientation as the substrate shall be more than 1 $mm^2$. In general, the single-oriented diamond can be defined as an assembly of diamond grains having an orientation similar to the orientation of the substrate within a small difference less than 10 degrees. For a free-standing diamond film, the single oriented diamond film can be defined as an assembly of diamond grains having an orientation similar to the orientation of others.

Figure 20:
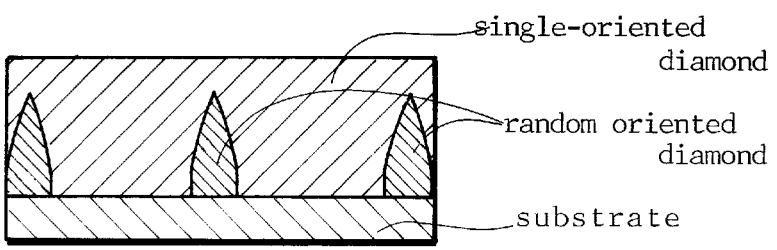
FIG. 20 is a sectional front view of the diamond wafer having random-oriented diamond films and single-oriented diamond films which conceal the random-oriented films on the substrate.
Figure 23:
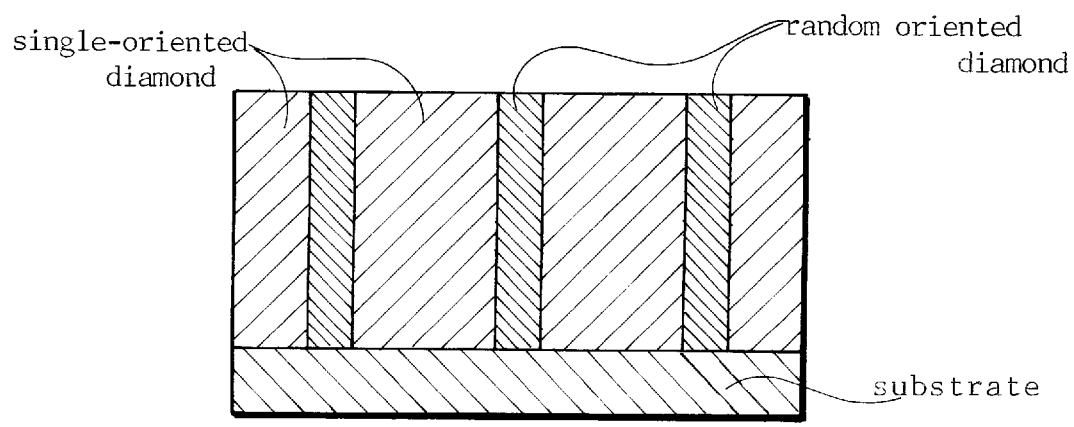
FIG. 23 is a sectional view of a wafer which has a substrate and single-oriented diamond films and random-oriented diamond films periodically grown on the substrate, the random-oriented diamond films reveal to a free surface.
Figure 30:
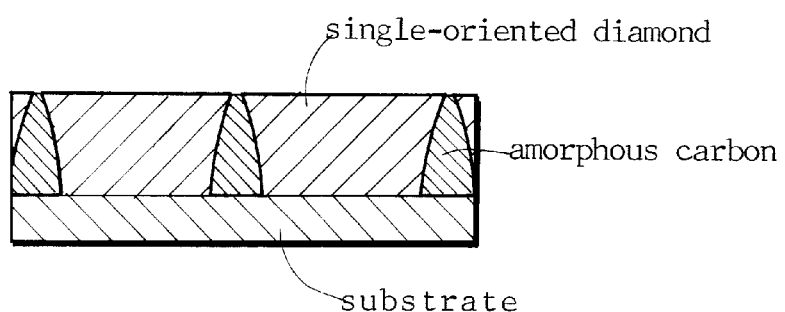
FIG. 30 is a sectional view of the substrate, amorphous carbon films and a single-oriented diamond films.

The inhomogeneous diamond film reinforces the coupling force of the interface. FIG. 20 indicates the section of the improved diamond wafer. Periodic random-oriented diamond raises the resistance against peeling. FIG. 20 shows an example in which the single-oriented diamond fully covers the substrate. Since the random-oriented diamond is concealed, the properties of the surface are excellent. An fully periodic structure is also available. FIG. 23 indicates the full periodic film in which the random-oriented diamond regions reveal in the free surface. The periodic elements can be replaced by cavities or amorphous carbon instead of the random-oriented diamond. FIG. 22 shows another example reinforced by periodically disposed cavities. FIG. 30 indicates an example reinforced by a periodic structure of partial hills of amorphous carbon.

If the substrate is eliminated by solving or polishing form the specimen of FIG. 23, a free standing diamond wafer will be obtained. The freestanding diamond wafer consists only of diamond. The freestanding film contains periodically the random-oriented regions and the single-oriented regions.

0.1% to 50% is the suitable ratio of the random-oriented diamond to the whole diamond. Less than 0.1% is ineffective for raising the strength. More than 50% degrades the quality of the film.

The random-oriented diamond is effective for reinforcing the junction strength of the interface. The random-oriented diamond can either be revealed on the free surface of the complex diamond film or be concealed with the single-oriented diamond. Both the appearing and the submerging random-oriented diamond are effective for increasing the strength of the interface.

Figure 29:
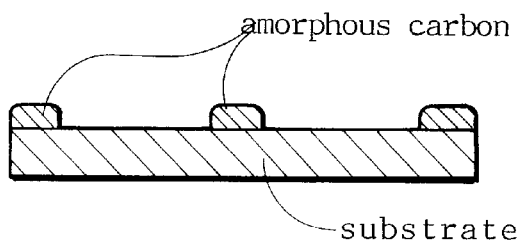
FIG. 29 is a sectional view of a substrate and amorphous carbon films periodically deposited on the substrate.

For the same purpose, the random-oriented diamond can be replaced by non-diamond carbon ingredients, namely amorphous carbon or graphitic carbon. The non-diamond carbon ingredients can be synthesized by the same vapor phase deposition method which grows the single-oriented diamond. FIG. 29 and FIG. 30 indicate the process of reinforcing the interface by non-diamond carbon ingredients.

Furthermore, cavities are also effective for reinforcing the interface between the substrate and the single-oriented diamond. If cavities are positively distributed on the interface, the cavities alleviate the shock by absorbing the strong force by deforming elastically. Thus, the disposition of cavities prevents the diamond film from exfoliating out of the substrate. The effective ratio of the cavities is 0.1% to 50% in area in the vicinity of the interface. The cavities can be produced by perforating seed holes by a laser, for example, a YAG laser or an excimer laser before the synthesis of diamond.

These are the contrivances of reinforcing the interface. Then the processes of making a diamond wafer will be explained by referring to embodiments and comparison examples.

Diamond coated wafers are produced and interdigital electrodes are formed on the wafers by the steps showing by FIG. 3 to FIG. 7. Then the yields against wire-break are examined for all the specimens. The specimen wafers are produced by the conditions indicated in the following tables. The results of measurements are also listed in other tables. The samples select silicon single crystal wafers as a substrate, although this invention can be applied also to Ni, Cu, Ni—Cu alloy, SiC single crystals. The starting substrates are distorted round Si substrates. Diamond is deposited on the convex surface of the substrates by the microwave plasma CVD method, the filament CVD method or the plasma jet CVD method. The pressure at the reaction ranges from 1 Torr(133 Pa) to 300 Torr(40 kPa).

In the case of the silicon substrate, a β-SiC (cubic silicon carbide or c-SiC) film is preferably grown as an intermediate layer. The β-SiC is grown by supplying a material gas of high carbon concentration and by applying a negative bias between −1000V and −20V on the substrate. Preferable range is −1000V to −50V. In the case of using methane gas, the mol ratio ($CH_4/H_2$) of methane to hydrogen gas shall be more than 2%. In general, the atomic ratio (C/H) shall be bigger than 1%. When the β-SiC film has been deposited, the carbon concentration in the material gas shall be reduced to make a diamond film. The lower carbon concentration gas contains methane of 0.1 vol % to 2 vol % to hydrogen in the case of methane. In general, the carbon atomic ratio (C/H) to hydrogen atom is 0.05 at % to 1 at % in the lower carbon concentration gas for the synthesis of diamond films.

Figure 4:
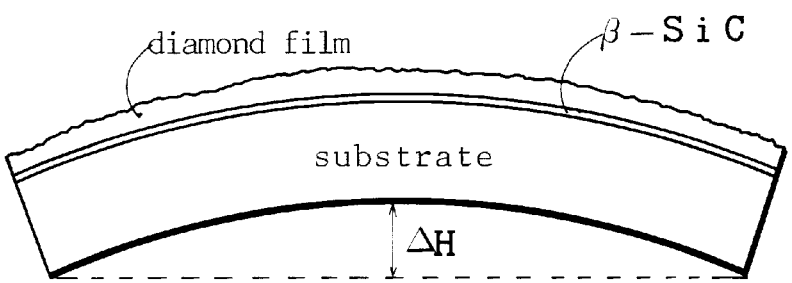
FIG. 4 is a sectional view of the convex substrate, an intermediate SiC and a rugged diamond film deposited on the substrate.
Figure 5:
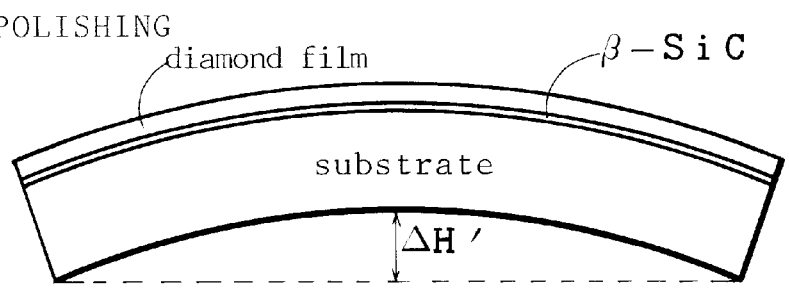
FIG. 5 is a sectional view of the convex substrate, an intermediate SiC and a polished diamond film deposited on the substrate.
Figure 6:
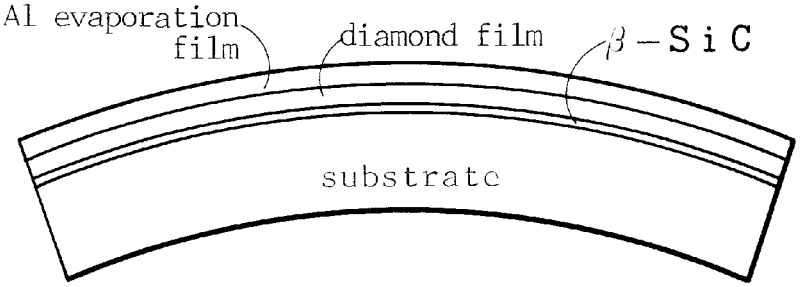
FIG. 6 is a sectional view of the convex substrate, an intermediate SiC, a polished diamond film and an aluminum layer evaporated on the diamond film.
Figure 7:
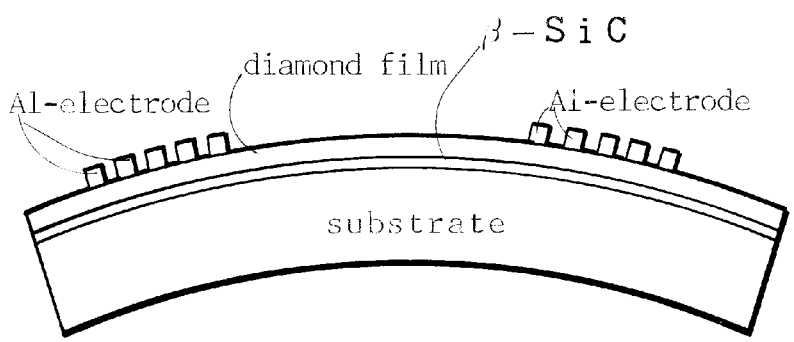
FIG. 7 is a sectional view of the convex substrate, an intermediate SiC, a polished diamond film and aluminum interdigital electrodes formed on the diamond film.

FIG. 4 indicates the section of the distorted wafer having a substrate, a β-SiC film and a rugged diamond film. The thermal stress occurring between the films and the substrate may slightly change the curvature of the substrate. The change of the distortion, however, is quite a little. The relation between the initial distortion and the intermediate distortion depends upon the method and the conditions of production of the films. In any case, the substrate, the conditions and the methods shall be determined in order that the post-film-formation distortion should satisfy the inequality $-150\ \mu m \leq \Delta H \leq -2\ \mu m$. Then the convex diamond surface is then polished by the mechanical polishing machine of this invention. The surface of the diamond film becomes a smooth surface like a mirror (FIG. 5). Then an aluminum film is evaporated on the diamond film, as exhibited in FIG. 6. Parallel microwire patterns are formed by selectively etching the aluminum film. FIG. 7 indicates the section of the microwire patterns which form interdigital electrodes of SAW devices. Then the yields against wire-break are examined for all the samples.

Samples 1 to 12: Homogeneous Heteroepitaxy

Table 1 to Table 6 show the conditions or the results of the diamond formation, the polishing or the yield of the electrodes. Twelve samples are explained one by one. FIG. 1 indicates the thickness, the diameter and the initial distortion ($\Delta H$) of the substrates.

TABLE 1

Substrates, substrate thickness, substrate diameter and distortion

| NO | substrate | substrate thickness (mm) | substrate diameter (inch φ) | distortion (μm) |
|----|-----------|--------------------------|-----------------------------|-----------------|
| 1  | Si (100)  | 1    | 2   | −5   |
| 2  | Si (100)  | 1    | 4   | −15  |
| 3  | Si (111)  | 0.35 | 8   | −60  |
| 4  | Si (100)  | 0.1  | 1   | −10  |
| 5  | Si (100)  | 0.8  | 3   | −2.5 |
| 6  | Si (110)  | 0.5  | 2   | −10  |
| 7  | Si (111)  | 0.3  | 5   | −2.5 |
| 8  | Si (110)  | 1    | 4   | −15  |
| 9  | Si (100)  | 0.05 | 2   | +200 |
| 10 | Si (111)  | 1    | 8   | +400 |
| 11 | Si (110)  | 3    | 0.5 | 0    |
| 12 | Si (100)  | 0.5  | 3   | 0    |

Here samples 1 to 8 are embodiments. Samples 9 to 12 are comparison examples. The unit of the thickness of substrates is millimeter(mm). The unit of the diameter of substrates is inch. The distortion of the substrates are not determined yet, before the film has been deposited. Minus sign "−" means that diamond will be grown on the convex side of surfaces of the substrates. Plus sign "+" means that diamond will be synthesized on the concave side.

Sample 1 adopts a (100) Si wafer of a 1 mm thickness of a 2 inch diameter. The distortion is −5 μm. The substrate of sample 2 is a 1 mm thick (100) Si wafer of a four-inch diameter with a distortion height of −15 μm.

Sample 3 uses a 8-inch (111) Si wafer of a 0.35 mm thickness having a big negative distortion of −60 μm. Sample 4 starts from a thin (100) silicon wafer of a 0.1 mm thickness having a 1 inch diameter. The inherent distortion is −10 μm.

Sample 5 employs a 3 inch (100) Si wafer of a 0.8 mm thickness with a negative distortion $\Delta H$ of −2.5 μm. Sample 6 is based on a 0.5 mm thick (110) wafer of a 2 inch diameter with a −10 μm distortion. The substrate of sample 7 is a (111) Si wafer of a 0.3 mm thickness with a 5 inch diameter. The distortion is −2.5 μm.

Sample 8 uses a (110) Si wafer of a 1 mm thickness with a 4 inch diameter. The distortion is −15 μm. The above samples are all embodiments having negative distortion of $\Delta H$ between −150 μm and −2 μm.

The following four are comparison examples. Sample 9 adopts a 0.05 mm thick (100) Si wafer of a 2 inch diameter with a distortion of +200 μm. Sample 10 uses a 8 inch (111) Si wafer of a 1 mm thickness having +400 μm distortion. Sample 11 employs an even 3 mm thick (110) silicon wafer of a 0.5 inch diameter. This is immune from distortion ($\Delta H=0$). Sample 12 adopts a flat 3 inch wafer of a 0.5 mm thickness. This is also free from distortion. The comparison examples have positive or zero distortion.

SiC films and diamond films are grown on the substrates by the microwave plasma CVD method, the filament CVD method or the plasma jet CVD method. The volume ratio of a hydrocarbon gas to hydrogen gas are sometimes different between the earlier step and the later step. It is preferable to enhance the ratio of a hydrocarbon gas in order to make a SiC film in an early step. Some examples apply a bias to the substrate. At first, the CVD methods of growing the films are explained by referring to FIG. 8 to FIG. 10.

Figure 8:
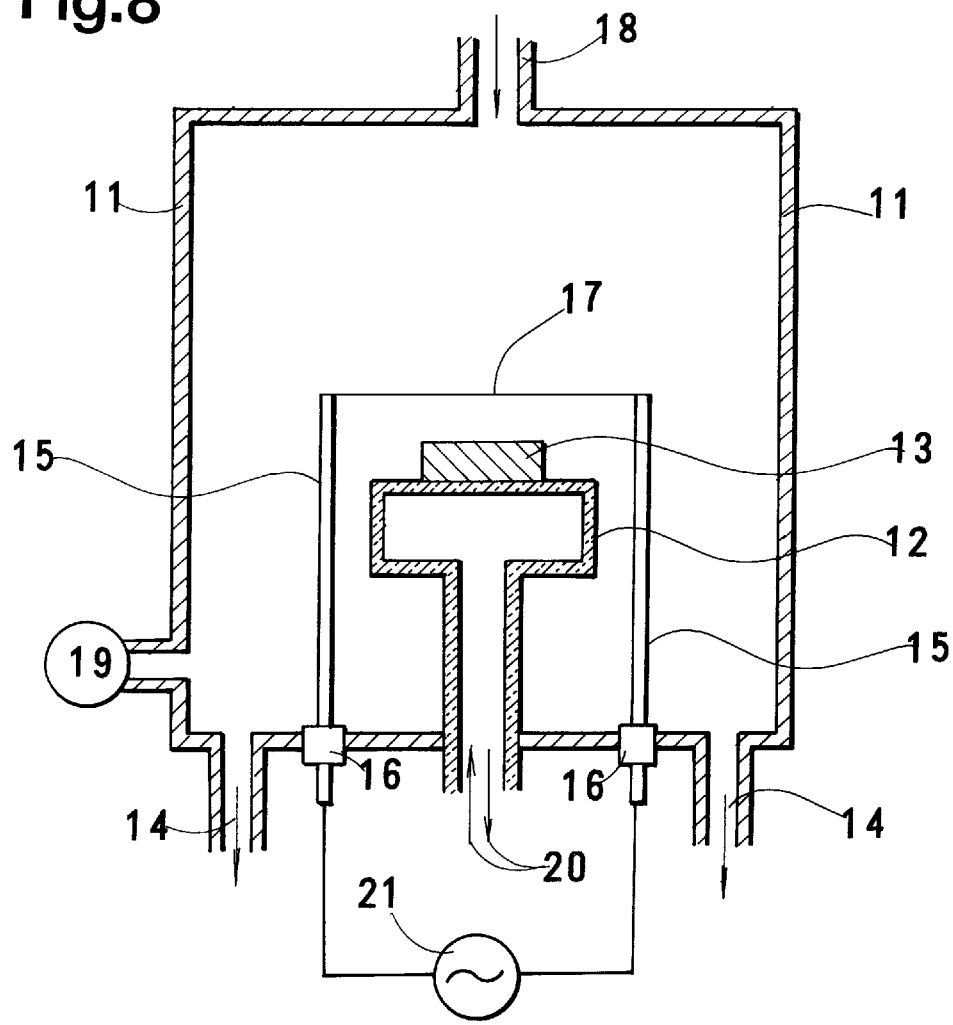
FIG. 8 is a schematic view of a filament CVD apparatus.

FIG. 8 indicates a schematic section of a filament CVD apparatus. A vacuum chamber (11) has a susceptor (12) at a center. A substrate (13) is held on the susceptor (12). The vacuum chamber (11) is equipped with gas outlets (14) which communicate with a vacuum pump (not shown in the figure). Electrodes (15) stand in the vicinity of the susceptor (12). A filament (17) spans the electrodes (15). The chamber (11) has a gas inlet (18) for introducing a material gas containing hydrogen gas and a hydrocarbon gas into the inner space. The pressure is monitored by a vacuum gauge (19). A power source (21) is connected to the electrodes (15) for supplying a current to the filament (17). The filament (17) heats the substrate (13) and the introduced gas. A coolant (20) is ventilated in the susceptor (12) for maintaining the substrate (13) at a pertinent temperature by the balance between heating by the filament and cooling by the coolant. The heat of the filament excites the material gas, induces vapor phase reaction in the gas. The results of the reaction are deposited on the substrate (13). Sometimes a bias is applied to the substrate (13) for facilitating the generation of a SiC layer.

Figure 24:
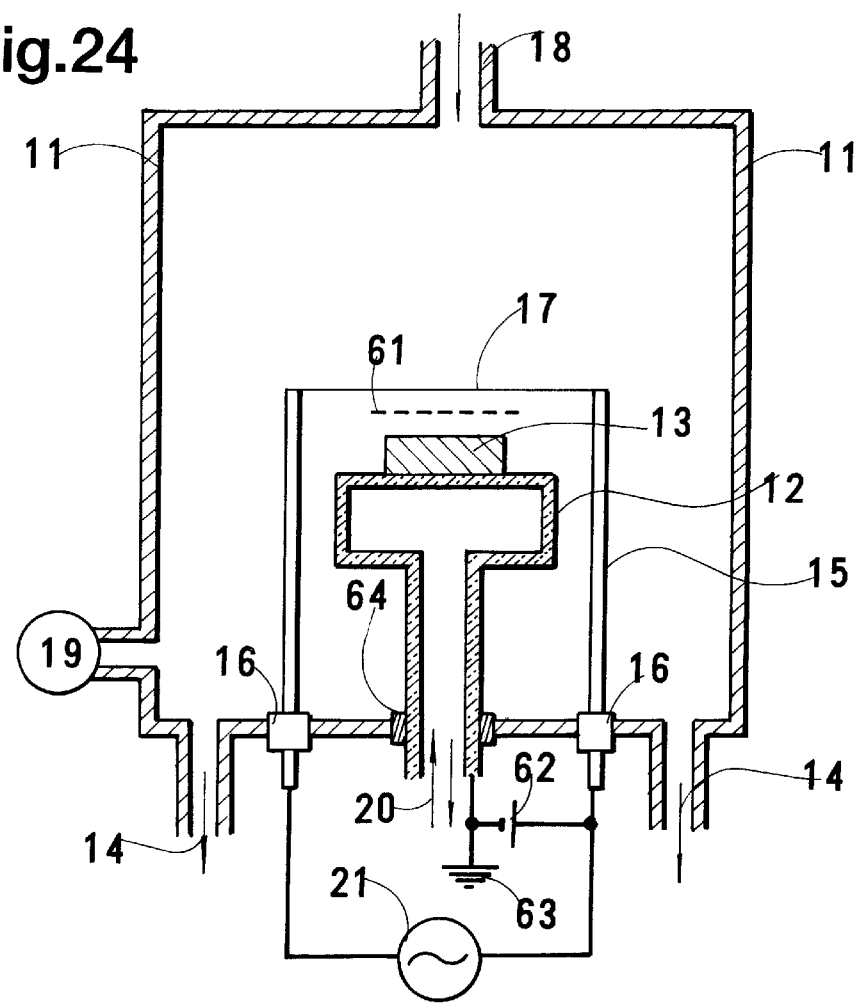
FIG. 24 is a schematic view of a filament CVD apparatus improved from the apparatus of FIG. 8.

FIG. 24 indicates an improvement of the apparatus of FIG. 8. A grid (61) is interposed between the filament (17) and the substrate (12). The substrate (12) is insulated from the chamber (11) by Insulators (64). The substrate (12) is connected to a ground terminal (63). The substrate (12) is negatively biased by a power source (62) to the filament (17). The insertion of the grid (61) enhances the uniformity of the electric field above the substrate. The grid can be made by a metal. Preferably the material of the grid, however, should be boron-doped diamond. The boron-doped diamond grid will suppress the inclusion of impurity in a growing diamond film.

Figure 9:
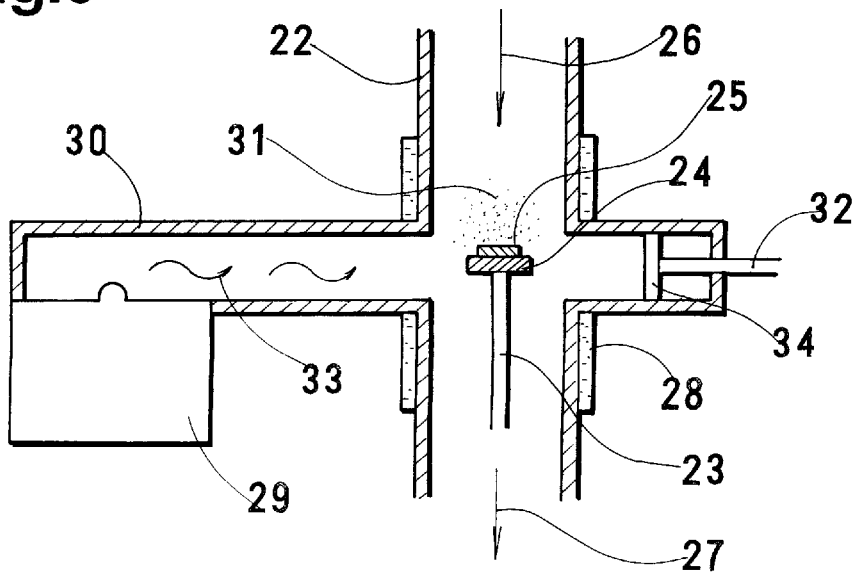
FIG. 9 is a schematic view of a microwave plasma CVD apparatus.

FIG. 9 shows a schematic view of a microwave plasma CVD apparatus. The apparatus has a longitudinal reaction chamber (22). A material gas flows from top to bottom in the reaction chamber (22). A susceptor (24) is mounted on the top end of the supporting shaft (23). A substrate (25) is positioned on the susceptor (24). The material gas is introduced from a top inlet (26) of the vertical chamber (22). The material gas passes near the substrate (25) and goes out of the chamber (22) from a bottom outlet (27). The part In which plasma is generated is cooled by a cooling device (28). The microwave (33) oscillated by a magnetron (29) propagates in the longitudinal vacuum wave guide (30). Progressing in the direction orthogonal to the flow of the material gas, the microwave excites the material gas into plasma (31). Near the end of the wave guide, a resonance plate (34) is furnished, facing to the plasma region (31). A piston (32) moves the resonance plate (34) in the horizontal direction. A pertinent mode of stationary waves stands between the wave guide (30) and the resonance plate (34).

results on the heated substrate. Diamond films can be made by other methods. The embodiments, however, make diamond films by any one of the explained methods. Table 2 indicates the methods, the conditions of making the diamond films for all the samples

TABLE 2

Methods and conditions of synthesis of diamond film

| | | earlier stage | | | later stage | |
|---|---|---|---|---|---|---|
| NO | Method | $(CH_4/H_2)$ (%) | substrate bias (V) | synthesizing times (min) | $(CH_4/H_2)$ (%) | substrate bias (V) |
| 1 | Microwave CVD | 4 | −200 | 30 | 1 | no |
| 2 | Microwave CVD | 15 | −300 | 5 | 3 | no |
| 3 | Microwave CVD | 2 | no | 30 | 0.5 | no |
| 4 | Filament CVD | 5 | −50 | 30 | 2 | no |
| 5 | Filament CVD | 4 | −150 | 10 | 1 | no |
| 6 | Filament CVD | 30 | no | 60 | 3 | no |
| 7 | Plasma Jet CVD | 10 | −400 | 15 | 1 | no |
| 8 | Microwave CVD | 20 | no | 90 | 0.5 | no |
| 9 | Microwave CVD | 0.5 | +150 | | 0.5 | no |
| 10 | Filament CVD | 3 | no | | 3 | +200 |
| 11 | Filament CVD | 2 | −10 | | 2 | no |
| 12 | Microwave CVD | 3 | no | | 2 | no |

Figure 25:
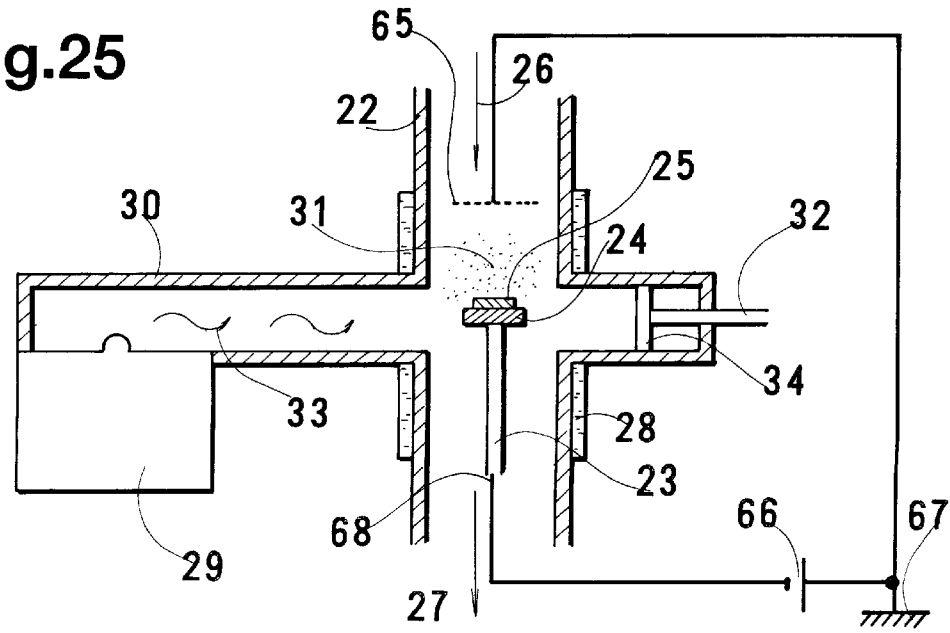
FIG. 25 is a schematic view of a microwave plasma CVD apparatus improved from the apparatus of FIG. 9.

FIG. 25 exhibits an improvement of the apparatus of FIG. 9. An extra electrode (65) having holes is furnished above the substrate. The substrate (24) is negatively biased by a power source (66) to the space electrode (65). This is an apparatus of adopting TE modes of microwaves.

Figure 26:
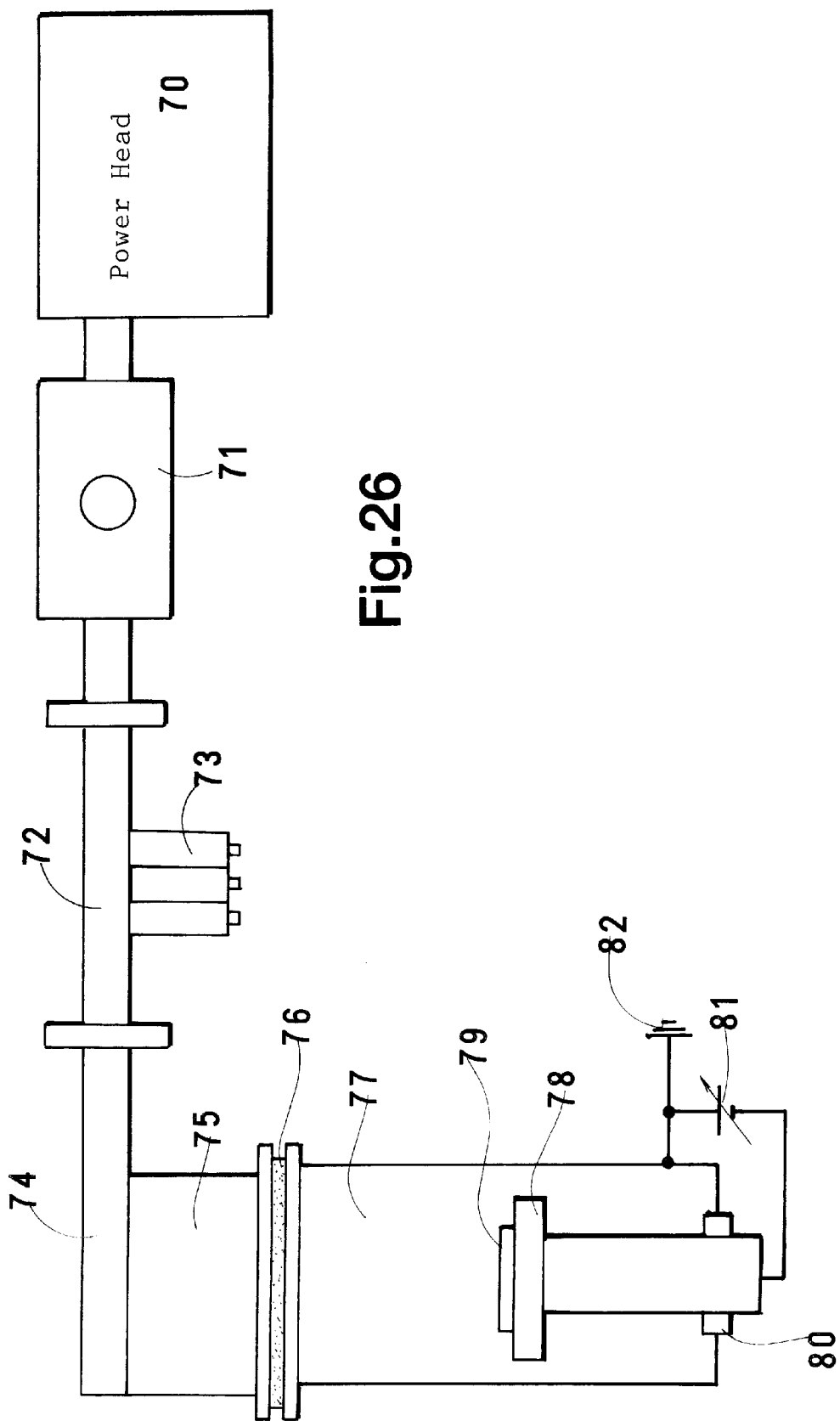
FIG. 26 is a schematic view of another microwave plasma CVD apparatus.

FIG. 26 is a schematic view of another microwave plasma CVD apparatus which make use of TM modes of microwaves. This apparatus includes a power head (70) of yielding microwave by a magnetron. The microwave propagates from the power head via an antenna (71) in a wave guide (72) with a mode selector (73). Then the microwave turns at a right angle at a turning point (74) and attains a space (75) in front of a reaction chamber (77). The microwave passes a dielectric window (76) and penetrates into the vacuum chamber (77). In the chamber, a susceptor (78) stands at the center holding a substrate (79). The susceptor (78) is isolated from the chamber (77) by insulators (80). A power source (81) applies a negative bias on the susceptor (78).

Figure 10:
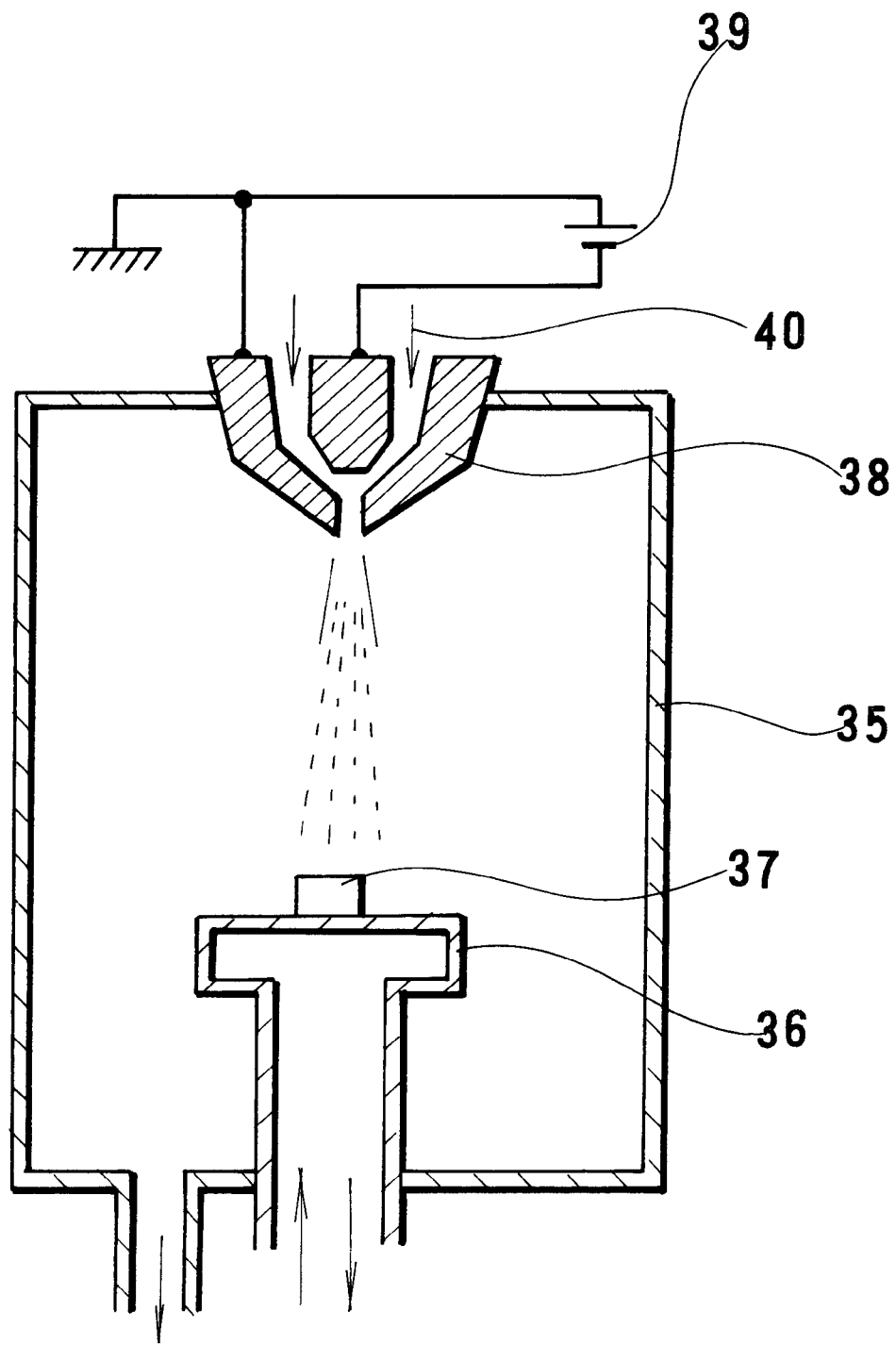
FIG. 10 is a schematic view of an arc plasma jet CVD apparatus.

FIG. 10 denotes a section of a plasma jet CVD apparatus. A vacuum chamber (35) is equipped with a susceptor (36) near the bottom. A substrate (37) is positioned on the susceptor (36). A plasma torch (38) is supported at the top of the chamber (35), facing to the susceptor (36). The plasma torch (38) has a cathode at the center and a cylindrical anode. A material gas passes through the passageway between the cathode and the anode. A power source (39) supplies a DC voltage between the cathode and the anode of the plasma torch. DC discharge induced in the torch excites the gas into plasma. The gas includes a gas for keeping plasma e.g., argon gas or hydrogen gas and hydrocarbon gas for supplying carbon.

Figure 27:
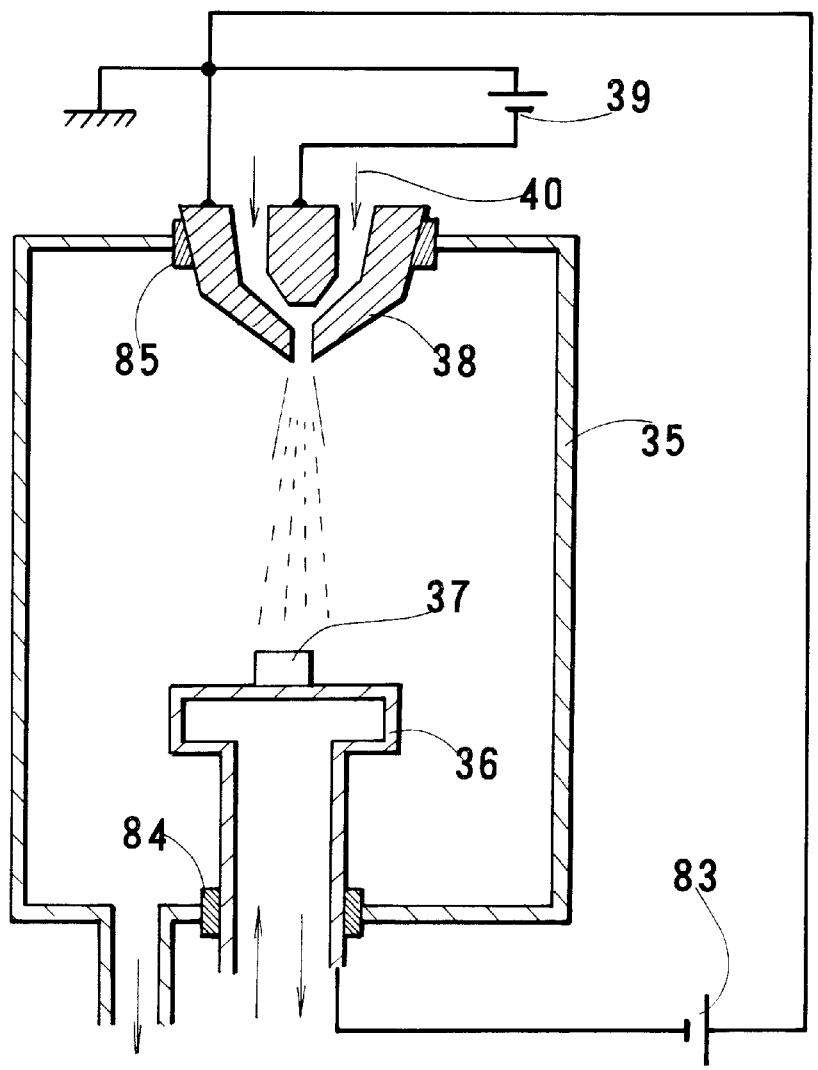
FIG. 27 is a schematic view of an arc plasma jet CVD apparatus improved from the apparatus of FIG. 10.
Figure 28:
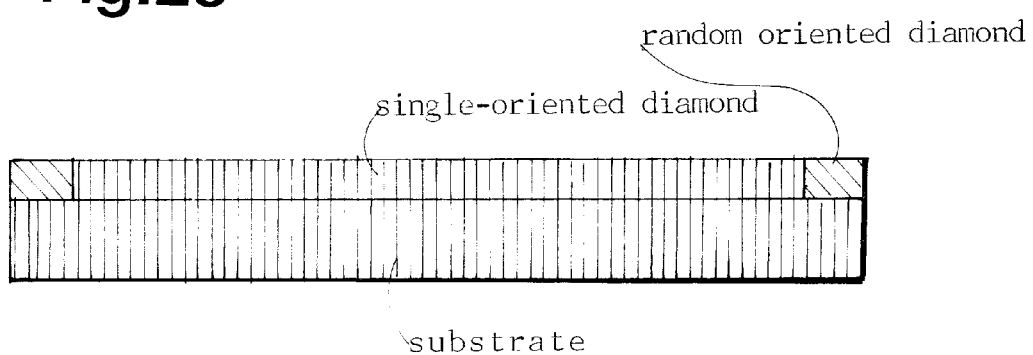
FIG. 28 is a sectional view of a wafer which has a single-oriented diamond region and a random-oriented diamond ring-region on the periphery which is obtained by the CVD synthesis from the state of FIG. 22.

FIG. 27 denotes an improvement of the apparatus of FIG. 10. The plasma torch (38) is separated from the chamber by insulators (85). The substrate (38) is isolated from the chamber (35) by insulators (84). A power source (83) applies a negative voltage on the plasma torch (38).

The synthesis of diamond films has, in general, the steps of supplying a material gas into a vacuum chamber, exciting the material gas by heat, microwave, discharge, inducing chemical reaction in the material gas and depositing the Embodiment 1 (Sample 1) makes films by the microwave plasma CVD method, supplying methane gas as a hydrocarbon gas. For the beginning 30 minutes, the volume ratio of methane/hydrogen is 4%. The substrate is biased with −200V, which facilitates the nucleus generation of hydrogen radicals. An SiC film is formed on the substrate by the cooperation of the negative bias and the high carbon concentration gas. Then the methane ratio is decreased to 1 vol%. The negative bias is removed from the substrate. Diamond grows on the SiC film under the conditions of no substrate bias and low carbon concentration.

Embodiment 2 (sample 2) also produces films by the microwave plasma CVD method. −300V is applied to the substrate for the early 5 minutes. The ratio of carbon/hydrogen is 15 vol % in the material gas for the same time. In the latter stage, the methane/hydrogen ratio is 3 vol %. No bias is given to the substrate.

Sample 3 is also prepared by the microwave plasma CVD method. The initial methane concentration is 2 vol %. The substrate is not biased in the early step of 30 minutes. The methane concentration is 0.5 vol % in the latter step in embodiment 3.

Sample 4 is made by the filament CVD method. For the early 30 minutes, the SiC film is grown with the methane/hydrogen ratio of 5% by applying a bias of −50V. In the later stage a diamond film is made by a lower methane concentration of 2 vol % without bias.

Sample 5 is fabricated by the filament CVD method of supplying a material gas of methane concentration of 4 vol % and applying −150 V to the substrate for 10 minutes of the early step. Then the methane concentration $(CH_4/H_2)$ is reduced to 1 vol %. The bias is eliminated.

Sample 6 is also made by the filament CVD method. High carbon concentration gas of 30 vol % is supplied to the susceptor without bias into the chamber in the early step of 60 minutes. Then the methane/hydrogen ratio is decreased to 3 vol % in the latter stage.

Embodiment 7 (sample 7) employs the plasma jet CVD method. In the early step of 15 minutes, a material gas of carbon concentration of 10 vol % is sent to the substrate biased with −400 V. Then the material gas is changed to the ratio of 1 vol %. The bias is removed.

Sample 8 is also made by the microwave plasma CVD method. In the first step of 90 minutes, a material gas including 20 vol % of methane is introduced to the substrate without bias. Then the methane ratio is reduced to 0.5 vol % in the following step. The susceptor is not biased.

Sample 9 (comparison example) is made by the microwave plasma CVD method of supplying a material gas having a methane concentration of 0.5 vol % from beginning to end. In the early step, a bias of +150 V is applied to the substrate, but the bias Is eliminated in the latter step.

Sample 10 is made b the filament CVD method of supplying a material gas of methane concentration of 3 vol from beginning to end. In the first step, no bias is applied to the substrate. Then in the latter step, a bias of +200 V is applied.

Sample 11 is prepared by the filament CVD method of replenishing a material gas of a methane ratio of 2 vol % into the chamber throughout the synthesis. The substrate is first applied with −10 V. Then the bias is gotten rid of from the susceptor.

Sample 12 is made by the microwave plasma CVD method. Initially the methane ratio is 3 vol %. Then the ratio falls to 2 vol %. No bias is given to the susceptor.

All the samples have a SiC film and a diamond film. The samples are estimated by measuring the thickness of the films and by examining success or failure of heteroepitaxy. Table 3 shows the results.

TABLE 3

Thickness of SiC films, diamond films and success of hetero epitaxy

| No. | β-SiC films thickness (nm) | β-SiC films success of hetero epitaxy | diamond films thickness (μm) | diamond films success of hetero epitaxy |
| --- | --- | --- | --- | --- |
| 1 | 10 | ○ | 30 | ○ |
| 2 | 5 | ○ | 50 | ○ |
| 3 | 15 | ○ | 100 | ○ |
| 4 | 20 | ○ | 15 | ○ |
| 5 | 8 | ○ | 5 | ○ |
| 6 | 25 | ○ | 30 | ○ |
| 7 | 15 | ○ | 100 | ○ |
| 8 | 8 | ○ | 5 | ○ |
| 9 | 80 | × | 150 | × |
| 10 | 580 | × | 800 | × |
| 11 | 1 | ○ | 2 | ○ |
| 12 | 10 | ○ | 30 | ○ |

In Table 3, the unit of the SiC film thickness is nm ($10^{-9}$ m). But the unit of the diamond film is μm($10^{-6}$ m). The success or failure of heteroepitaxy means the performance of the heteroepitaxial growth of SiC films and diamond films. If the crystallographical directions of the substrate, the SiC film and the diamond film are all the same, the sample is judged as a success of heteroepitaxy. The success cases are denoted by "○". If the substrate, the SiC film and the diamond film have different crystallographical directions, the sample is judged as a failure of heteroepitaxy. The failure cases are indicated by "×". For example, when a (111) SiC film and a (111) diamond film are grown on a (111) Si substrate, the sample is judged as a success of heteroepitaxy. The alignment of crystallographical directions of the crystals is investigated by examining the diffraction spots in the RHEED (Reflection high energy electron diffraction).

In sample 1, a 10 nm thick β-SiC film and a 30 μm thick diamond film are heteroepitaxially grown on the silicon (100) substrate. Since the substrate is Si (100), the β-SiC film and the diamond film are (100) oriented crystals.

Sample 2 has a 5 nm thick β-SiC film and a 50 μm thick diamond film heteroepitaxially deposited on the Si substrate. In sample 3, the (111) Si substrate has a 15 mm thick β-SiC film and a 100 μm thick diamond film heteroepitaxially deposited. In sample 4, a 20 nm β-SiC film is heteroepitaxially deposited on the Si (100) substrate and a diamond film of a 15 μm thickness are deposited on the Si (100) substrate.

In sample 5, the (100) Si substrate has an 8 nm thick β-SiC film and a 5 μm thick diamond film grown epitaxially thereon. Sample 6 obtains a β-SiC film of a 25 nm thickness and a diamond film of a 30 μm thickness.

Sample 7 grows heteroepitaxially a β-SiC film of 15 nm of thickness and a 100 μm thick diamond film on the substrate. Sample 8 succeeds in the heteroepitaxy of a β-SiC film of a 8 nm thickness and a diamond film of a 5 μm thickness on the substrate.

Sample 9, a comparison example, obtains an 80 nm thick β-SiC layer and a 150 μm thick diamond film. This is not a heteroepitaxial growth. The surface of the diamond is very rugged. The diamond and the β-SiC are not single crystals. Sample 10 is covered with a β-SiC film of a 580 nm thickness and a diamond film of an 800 μm by the synthesis. The deposition is not epitaxial. The roughness of the surface is larger than sample 9. The β-SiC and the diamond are polycrystalline.

Sample 11 forms a 1 nm β-SiC film and a 2 μm diamond film heteroepitaxially on the Si substrate. In sample 12, a 10 nm β-SiC film and a 30 μm diamond film are heteroepitaxially grown on the substrate. The surface is not a little rugged.

Then the roughness Rmax and Ra of the diamond surface are measured for all the samples. Rmax is the maximum of the differences of height among all points on the object surface. Ra is the average of the differences of height between peaks and their neighboring valley. There are other parameters for estimating the roughness of an object surface. This invention estimates the surface roughness by Rmax and Ra. The results are indicated in Table 4 in the unit of μm(=1000 nm).

TABLE 4

Roughness Rmax and Ra of diamond film synthesized

| NO | roughness of diamond film after synthesis | |
| --- | --- | --- |
| | Rmax (μm) | Ra (μm) |
| 1 | 0.25 | 0.08 |
| 2 | 0.32 | 0.11 |
| 3 | 0.95 | 0.38 |
| 4 | 0.2 | 0.095 |
| 5 | 0.1 | 0.04 |
| 6 | 0.33 | 0.13 |
| 7 | 0.98 | 0.43 |
| 8 | 0.14 | 0.06 |
| 9 | 15 | 6 |
| 10 | 30 | 9 |
| 11 | 1 | 0.3 |
| 12 | 8 | 2 |

The roughness Rmax of the diamond film widely disperses from 0.1 μm to 30 μm. The roughness Ra also widely disperses from 0.04 ∞m to 9 μm. The diamond film of sample 1 has a roughness of Rmax0.25 μm (250 nm) and Ra0.08 μm (80 nm). Sample 2 has a roughness of Rmax0.32 μm and Ra0.08 μm. Sample 3 has a little big roughness of Rmax0.95 μm and Ra0.38 μm. This may be caused by the wide substrate and the thick films. Sample 4 is favored with a small roughness of Rmax0.20 μm and Ra0.095 μm. Sample 5 has the lowest roughness of Rmax0.14 μm and Ra0.04 μm among the samples. The good smoothness may arise from the thinness of the films.

Sample 6 has a moderate roughness of Rmax0.33 μm and Ra0.13 μm. Sample 7 indicates a bad roughness of Rmax0.98 μm and Ra0.43 μm. The large roughness may be originated from the thick films and the wide substrate. Sample 8 has a roughness of Rmax0.14 μm and Ra0.06 μm. The good surface roughness may be a result of the thinness of the films.

Sample 9, comparison example, has a big roughness of Rmax15 μm and Ra6 μm. Unlike samples 1 to 8, the films are not epitaxially grown. The surface suffers from many convexes and concaves. Sample 10 has a larger roughness of Rmax30 μm and Ra9 μm than sample 9.

Sample 11 shows a lower roughness of Rmax1 μm and Ra0.3 μm which is lower than sample 9 and sample 10 but is quite higher than samples 1 to 8. Sample 12 has a roughness of Rmax8 μm and Ra2 μm. The films are heteroepitaxially grown on the substrate despite the big roughness.

The diamond film produced by the CVD method has so large a roughness that electronic devices cannot be fabricated on the diamond film by the photolithography, as it is. In any cases, the diamond film must be polished in order to make electronic devices or SAW devices thereon.

Figure 14:
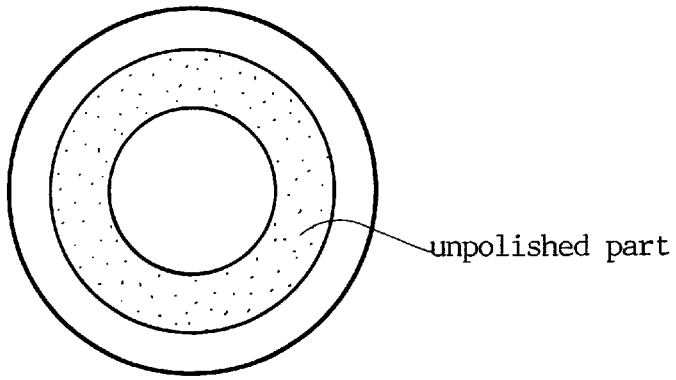
FIG. 14 is a plan view of the wafer after the conventional polishing process which has been concave-distorted before polishing.
Figure 15:
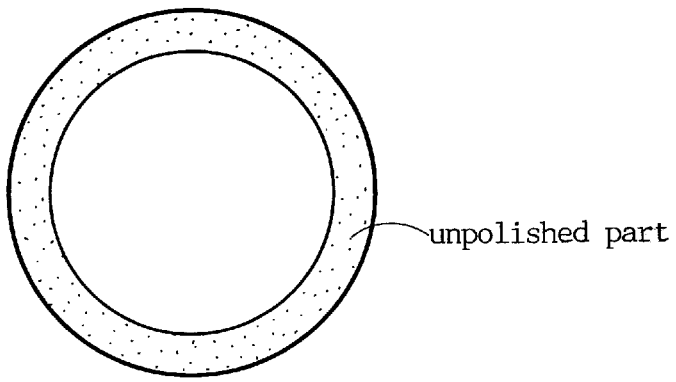
FIG. 15 is a plan view of the wafer after the conventional polishing process which has been convex-distorted before polishing.

Conventional polishing machines, however, are unable to polish such a distorted diamond film. The reason has been already explained by referring to FIG. 13 to FIG. 15. In order to polish the complex wafer, the distorted wafer will be stuck to a flat holder of the machine, the holder will be pushed on the turn-table and the turn-table will be revolved in the conventional machine. Unpolished portion will be left at the periphery for the convex-distorted wafer as shown in FIG. 15. Then diamond requires a special polishing machine. This invention also proposes a special machine for polishing the convex-distorted wafers.

The diamond films which are fitted to the substrate are mechanically polished by the special machine. Then the post-polishing roughness of the distortion are measured. The distortion is slightly reduced in general by polishing. Some samples cannot be fully polished by convexes and concaves. Then the ratio of the polished portions is examined.

The polishing method and the polishing apparatus of this invention are different from the conventional methods or machines which are currently used for making Si devices or GaAs devices. The polishing apparatus of the invention is now clarified.

Figure 11:
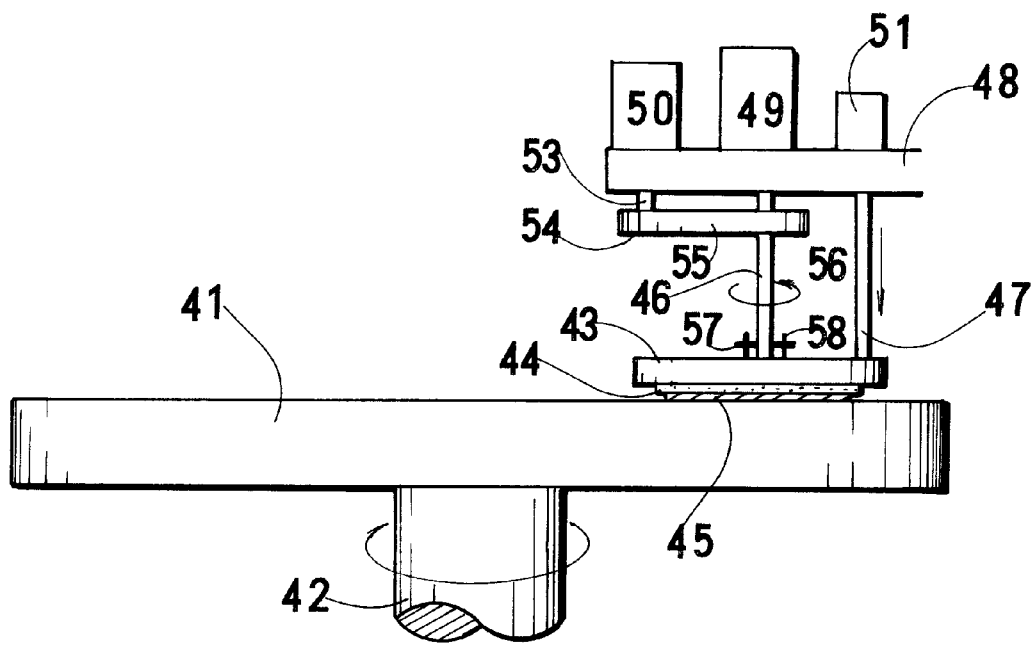
FIG. 11 is a side view of a polishing machine for polishing distorted wafers.
Figure 12:
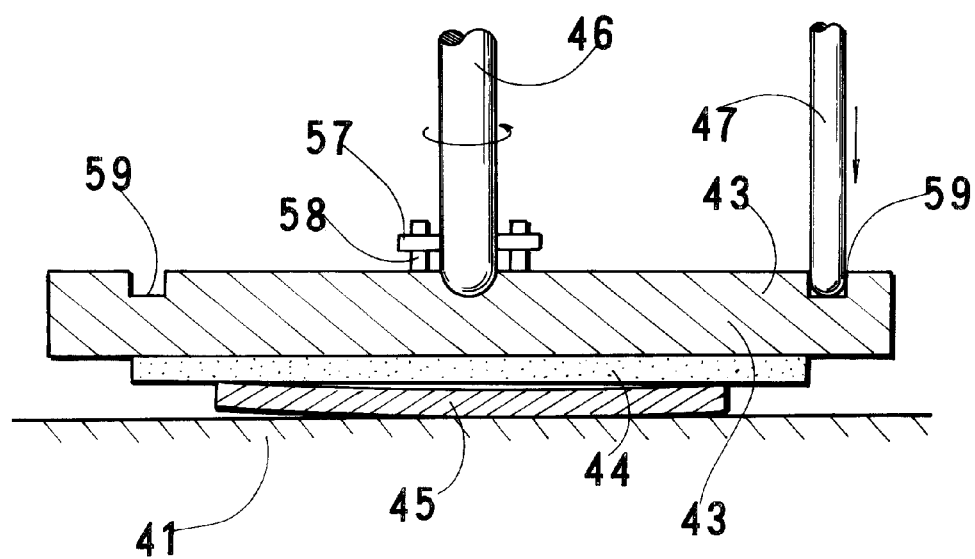
FIG. 12 is a enlarged section of the holder, the wafer and the turn-table of the polishing machine of FIG. 11.

FIG. 11 indicates the polishing machine. FIG. 12 shows the section of the holder. A turn-table (41) is supported at the top of the rotary shaft (42). The rotary shaft (42) rotates the turn-table (41). Diamond whetting powder covers the top of the turn-table (41). Since diamond is the object of polishing, diamond powder is used as the whetting powder fixed on the turn-table. The diamond powder grinds the object diamond by dissipating itself. It takes hundreds of hours to polish the diamond film by the turn-table (41) coated with diamond powder. A buffer (44), e.g., a rubber disc, is glued to the bottom of a holder (43). The complex diamond wafer (45) is stuck to the buffer (44). The use of the buffer (44) is one of the contrivances of the polishing machine. The buffer protects the wafer by absorbing external shocks.

A holder shaft (46) is fitted to the center of the top surface of the holder (43). The holder shaft (46) is not fixed to the holder (43). The holder shaft (46) can transmit the rotation torque to the holder (43) but allows the holder (43) to incline. The inclination of the holder (43) is another contrivance of the machine. The holder is rotatably supported by an arm (48). The wafer (45) is pressed by the holder (43) on the turn-table (41). The holder rotates around the shaft (46). The turn-table (41) revolves around the rotary shaft (42).

An auxiliary shaft (47) pushes a point of the top of the holder (43) and the auxiliary shaft (47) are supported by the arm (48). A first oil pressure cylinder (49) is mounted on the arm (48) for applying pressure on the holder shaft (46). The strong axial force compels the powder diamond to consume itself by the friction with the object diamond. The arm (48) has a motor (50) which drives the holder shaft (46). The torque is transmitted from the motor (50), via an output shaft (53) of the motor, a pulley (54), a belt (55) and a pulley (56) to the holder shaft (46). Then the holder (43) is rotated by the transmitted torque.

A second oil pressure cylinder (51) is mounted on the arm (48) for pressing the auxiliary shaft (47). FIG. 12 shows a circular groove (59) on the periphery of the holder (43). The auxiliary shaft (47) glides in the groove (59), pressing a point on the groove of the holder (43).

Pressing the center of the holder (43), the holder shaft (46) allows the holder (43) to incline to the shaft (46). The holder (43) inclines to the shaft (46) or to the turning-table (41) by the pressure of the auxiliary shaft (47). Since the wafer (45) is distorted in a convex shape, the inclination forces a region other than the center of the wafer to come into contact with the turn-table (41). The contact of a non-central point is the result of the pressure of the auxiliary shaft (47). The inclination angle depends on the pressure of the auxiliary shaft (47). The contact point of the wafer (45) with the turn-table (41) can be changed by varying the pressure of the auxiliary shaft (47). Gradual movement of the contact point in a radial direction enables the machine to polish all the convex surface of the diamond film. The wafer can be polished from the center to the periphery by the displacement of the contact point from the center to the periphery. Otherwise, the wafer can be polished from the periphery to the center by the reverse displacement.

Figure 13:
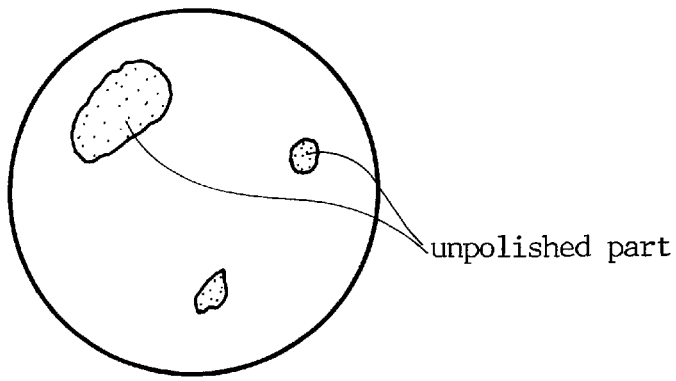
FIG. 13 is a plan view of the wafer after the conventional polishing process which has been flat before polishing.

As clarified before, conventional machines cannot fully polish a diamond film of any distortion. In the machines, the holder cannot incline to the shaft, because the shaft is fixed to the holder. Unpolished parts are left at random in the case of a flat (ΔH=0) wafer (FIG. 13). The center and the periphery are not polished in the case of a concave (ΔH≧0) wafer (FIG. 14). The periphery is unpolished in the case of a convex (ΔH≦0) wafer (FIG. 15).

Figure 16:
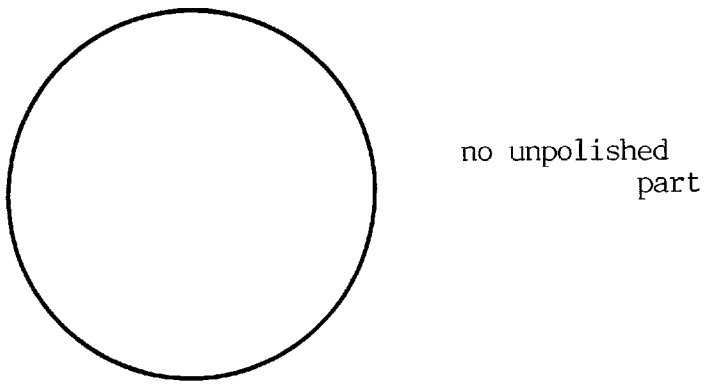
FIG. 16 is a plan view of the wafer after the polishing process of the present invention which has been convex-distorted before polishing.

This invention, however, can polish the entire surface of a convex-distorted wafer by using the holder inclinable to the shaft and by displacing the contact point in radial direction. FIG. 16 shows the surface of the wafer which has been polished by this invention without leaving unpolished portions. Then, all the samples are polished by the special apparatus of FIG. 11 and FIG. 12. The post-polishing roughness and the ratio of the polished portions are measured for each sample. Table 5 denotes the measured roughness and the measured polished ratio.

TABLE 5

Roughness of diamond films after polishing, ratio of polished portions

| NO | roughness (nm) Rmax | Ra | ratio of polished or unpolished portions (%) |
|---|---|---|---|
| 1 | 2 | 0.5 | 100% polished |
| 2 | 3 | 0.7 | 100% polished |
| 3 | 15 | 1.2 | 100% polished |
| 4 | 1.8 | 0.2 | 100% polished |
| 5 | 0.5 | 0.1 | 100% polished |
| 6 | 0.8 | 0.1 | 100% polished |
| 7 | 8 | 6 | 100% polished |
| 8 | 0.3 | 0.2 | 100% polished |
| 9 | 40 | 30 | 50% unpolished |
| 10 | 80 | 40 | 80% unpolished |
| 11 | unpolishable due to localization of contact point | | |
| 12 | 54 | 28 | 15% unpolished |

Table 5 adopts nanometer (nm) as a unit of roughness Rmax and Ra. Rmax disperses between 0.3 nm and 80 nm after the polishing. Ra varies from 0.1 nm to 40 nm.

Sample 1 which had a medium distortion reduces the roughness to Rmax2 nm and Ra0.5 nm by the polishing. 100% of the surface is polished. The distortion is scarcely changed by the polishing.

Sample 2 had a medium distortion after the synthesis. The polishing decreases the roughness to Rmax3 nm and Ra0.7 nm which allow the photolithography to depict wire patterns on the film. 100% of the wafer is polished. The distortion after polishing is similar to the distortion before polishing.

Sample 3 has a large roughness after the synthesis. The polishing reduces the roughness to Rmax15 nm and Ra1.2 nm which are still big. The distortion varies little. 100% of the surface is polished.

Sample 4 reveals a roughness of Rmax1.8 nm and Ra0.2 nm smaller than the precedents. Sample 5 had a small roughness before polishing. The roughness decreases to Rmax0.5 nm and Ra0.1 nm which are the lowest among all. The surface is quite smooth. The polishing does not vary the distortion. Polished ratio is 100%.

Sample 6 had a mean roughness before polishing. The roughness is reduced to Rmax0.8 nm and Ra0.1 nm by the polishing. This is a very smooth face. 100% of the surface is polished.

Sample 7 is inherently inferior in the pre-polishing roughness. The poor roughness is maintained after the polishing. The final roughness is Rmax8 nm and Ra6 nm. Polished ratio is 100%.

Sample 8 consists of a 4-inch Si (110) substrate, a SiC film and a diamond film grown on the SiC film. Sample 8 had a initial small roughness. The final roughness of Rmax0.3 nm and Ra0.2 nm is also good enough.

Sample 9, a comparison example, is inferior in the initial roughness after synthesis. The diamond film is not an epitaxial film. Polishing of sample 9 bluntly reduces the roughness to Rmax40 nm and Ra30 nm. The final surface has wide unpolished portions (50%). This is an evidence of the incompetence of a concave distorted wafer ($\Delta H \geq 0$). The wafer having such a big roughness cannot be treated by the semiconductor wafer process based on the photolithography.

Sample 10, another comparison example, has still bigger initial roughness before polishing than sample 9. The roughness is reduced to Rmax80 nm and Ra40 nm by the polishing. 80% of the surface is left unpolished. The imperfection arises from the concave distortion of the wafer ($\Delta H \geq 0$).

Sample 11 cannot be polished, since the contact point is restricted to a certain point. The flatness ($\Delta H=0$) prevents the movement of the contact point on the diamond film.

Sample 12 has a bad surface smoothness. Polishing gives sample 12 a big roughness of Rmax54 nm and Ra28 nm. 15% of the surface is not polished. The surface has still large ruggedness. It is inappropriate for making the semiconductor devices on the wafer. Although both samples 11 and 12 have heteroepitaxial films, they are inferior in the surface smoothness. Polishing is not effective for eliminating the ruggedness.

Then, aluminum is evaporated on the diamond films. The thickness of the aluminum film is 150 nm (=0.15 $\mu$m). Interdigital electrodes are fabricated by selectively etching the aluminum film by the photolithography. The electrodes have a line width ranging from 0.5 $\mu$m to 2 $\mu$m. The ruggedness of the diamond films sometimes break the electrode wire. Then the ratio of the samples immune from the wire-break (yield against break) is examined. The results are shown Table 6.

TABLE 6

Line width of aluminum electrodes formal on diamond films by evaporation and photolithography and yield against wire-break

| NO | Line width of aluminum electrodes ($\mu$m) | yield against wire break (%) |
|---|---|---|
| 1 | 1 | 99% |
| 2 | 0.8 | 97% |
| 3 | 1.2 | 94% |
| 4 | 1.5 | 96% |
| 5 | 0.6 | 95% |
| 6 | 1 | 99% |
| 7 | 0.8 | 92% |
| 8 | 2 | 90% |
| 9 | 1.5 | 10% |
| 10 | 0.5 | 8% |
| 11 | unpolishable, impossible to form electrodes | |
| 12 | 1.6 | 15% |

Sample 1 is a 2 inch (100) silicon wafer of −5 $\mu$m distortion having a 10 nm thick β-SiC film and a 30 $\mu$m thick diamond film polished. The yield against wire break is 99% in the final step of making the aluminum electrode patterns with a line width of 1 $\mu$m.

Sample 2 is a 4 inch (100) Si wafer of −15 $\mu$m distortion on which a 5 nm β-SiC film and 50 $\mu$m diamond film have been epitaxially grown. When interdigital electrodes of a line width of 0.8 $\mu$m are formed, the yield is 97%. Sample 2 clarifies that this invention allows the formation of submicron wire patterns with a high yield.

Sample 3 has been prepared by piling a 15 nm β-SiC film and a 100 $\mu$m diamond film on an 8-inch Si (111) wafer with a distortion of −60 $\mu$m. Despite the poor roughness of the polished diamond film, the yield is 94% for the wire patterns of a 1.2 $\mu$m line width. This is a satisfactory result.

Sample 4 has a 1-inch (100) Si wafer of −10 $\mu$m distortion, a 20 nm β-SiC film and a 15 $\mu$m diamond film. Sample 4 reveals a yield of 96%, when interdigital electrodes are formed in a line width of 1.5 $\mu$m.

Sample 5 consists of a 3 inch (100) silicon wafer of −2.5 deformation, a 8 nm β-SiC film and a 5 $\mu$m diamond film. Sample 5 is favored with excellent smoothness. The yield is 95% for the interdigital electrodes of a line width of 0.6 $\mu$m which is the narrowest among all the embodiments. Such a high yield is amazing for such a narrow line width.

Sample 6 has been made by coating a 2-inch (110) Si wafer of −10 μm distortion with a 25 nm β-SiC layer and a 30 μm diamond film. The yield is 99% for the wire patterns of a line width of 1 μm. The result is quite satisfactory.

Sample 7 is an embodiment having a 5-inch (111) silicon wafer, a 15 nm β-SiC film and a 100 μm diamond film. The roughness is not good (Rmax8 nm, Ra6 nm). The yield, however, is 92% which is also satisfactory.

Sample 8 has a 4-inch (110) Si wafer of −15 μm distortion, an 8 nm β-SiC layer and a 5 μm diamond film. Sample 8 is superior in the roughness and the distortion. When interdigital electrodes of a 2 μm line width are made on the diamond film, the yield is 90%.

All the embodiments exhibit more than 90% of the yield against wire-break for the formation of interdigital electrodes. Namely, the narrow wires are hardly broken in the embodiments. The sufficient high yield derives from the extreme smoothness of the diamond film. SAW devices of high quality will be obtained with high yield by applying the diamond wafers of the invention as the material of the SAW devices. When the wafer is applied to the semiconductor devices, various device structures can be fabricated by the photolithography.

Comparison examples are now clarified. Sample 9 has been made by depositing a 80 nm β-SiC film and a 150 μm diamond film on a 2-inch (100) Si wafer of +200 μm distortion. The yield of making the interdigital electrodes of 1.5 μm of a line width is 10%. The poor yield is caused by the big roughness. The ragged surface impedes the photolithography from fabricating micropatterns of electrodes.

Sample 10 has an 8-inch (111) Si wafer of +400 μm distortion, a 580 nm β-SiC film and an 800 μm diamond film. Sample 10 is plagued with bad roughness. The yield against the wire-break is 8%, when the electrodes of a 0.5 μm line width is produced on the ragged surface. The film has so big roughness that the photolithography technique cannot produce fine wire patterns.

Sample 11 has been made by forming a 1 nm β-SiC film and a 2 μm diamond film on a 0.5-inch (110) Si wafer without distortion. This sample cannot be polished by the machine of FIG. 11 and FIG. 12. Thus, electrodes are not formed on the sample because of the incapability of polishing.

Sample 12 has a flat Si (110) wafer substrate without distortion, a 10 nm β-SiC film and a 30 μm diamond film. The yield is 15%, when interdigital electrodes of a 1.6 μm line width is formed on the diamond face. It is impossible to make microwire patterns on the surface of diamond. Despite the macroscopic flatness, sample 12 is annoyed at wave or twist. Such a flat wafer cannot be whetted into a sufficiently smooth face even by the apparatus shown in FIG. 11 and FIG. 12. The big roughness prevents the photolithography from making electrodes with a high yield.

Sample13: Inhomogeneous Embodiment, Single-Orientation & Random-Orientation

A 3-inch Si {111} single crystal with a mirror surface is prepared as a substrate. The substrate was annealed up to 1000° C. in methane ($CH_4$) atmosphere for 1 minute in order to form cubic SiC layer whose thickness was 100 nm. The RHEED observation showed that the SiC layer was grown epitaxially. A circular periphery with a 2 mm breadth is scratched by sandblasting diamond powder of average diameter of 50 μm, as denoted in FIG. 22. The other part is left untouched and smooth. Diamond is grown on the partially bruised substrate by a hot filament CVD method under the conditions;

| Filament | tungsten filament |
|---|---|
| Substrate Temperature | 930° C. |
| Synthesis Time | 100 Hours |
| Pressure | 80 Torr (10 kPa) |
| Total Gas Flux | 800 sccm |
| Gas Component | |
| Early 10 minutes | |
| hydrogen | 97.8 vol % |
| methane | 2.2 Vol % |
| Later 99 H 50 min | |
| hydrogen | 99.2 vol % |
| methane | 0.8 vol % |
| Substrate Bias | |
| Early 10 minutes | −125 V~−150 V |
| Later 99 H 50 min | 0 V |
| Film Thickness | 50 μm |

A 50 μm thick diamond film is piled overall on the Si substrate. The crystallographical orientation is examined for the diamond film by the X-ray diffraction method. More than 98% of diamond grains have an orientation <111>±2° except the peripheral part. Namely, the diamond is orientation aligning to the substrate Si (111). Although diamond granules slightly are slanting to the orientation of the substrate, the rotation of diamond grains is at most 4 degrees. Almost all grains are fitting to the substrate.

At the periphery which has been scratched by sandblasting, diamond grains are randomly-oriented. The diamond is totally polycrystalline at the scratched portion. The central part and the middle part may be called a single crystal, since more than 98% of grains are aligned in the same direction as the substrate orientation. In general, this invention deems a diamond region as a "single-oriented", if in the region, more than 60% of crystal grains have orientations parallel with the substrate orientation with a deviation less than 10 degrees. Sample 13 satisfies the definition at the central part on the wafer. The distortion is −20 μm.

The film is polished by the polishing machine. The whole surface is mirror polished. The diamond film is not peeled off from the substrate. The peripheral polycrystal prevents the diamond film from exfoliating.

Sample14: Homogeneous Comparison Example, Single-Orientation

Another sample without the peripheral random-oriented part is made for examining the reinforcement of the random-oriented diamond. A 3-inch Si {111} single crystal with a mirror surface is prepared as a substrate. The substrate is not scratched at all. Diamond is grown on the mirror polished substrate by a hot filament CVD method under the conditions;

| Filament | tungsten filament |
|---|---|
| Substrate Temperature | 1050° C. |
| Synthesis Time | 100 Hours |
| Pressure | 250 Torr (33 kPa) |
| Total Gas Flux | 800 sccm |
| Gas Component | |
| Early 10 minutes | |
| hydrogen | 97.8 vol % |
| methane | 2.2 Vol % |
| Later 99 H 50 min | |
| hydrogen | 99.2 vol % |

| | |
|---|---|
| methane | 0.8 vol % |
| Substrate Bias | |
| Early 10 minutes | −125 V~−150 V |
| Later 99 H 50 min | 0 V |
| Film Thickness | 90 μm |

A 50 μm thick diamond film is piled overall on the Si substrate. The crystallographical orientation is examined for the diamond film by the X-ray diffraction method. More than 98% of diamond grains have an orientation <111>±2° in the whole diamond film. Namely, the diamond is orientation aligning to the substrate Si (111). These results are similar to sample 13. The distortion is +52 μm.

The film is polished by the polishing machine. When about 50% of the surface is mirror polished, the diamond exfoliates at the periphery of a area of 30 mm$^2$. This sample indicates the weak junction of homogeneous diamond to the substrate.

Figure 17:
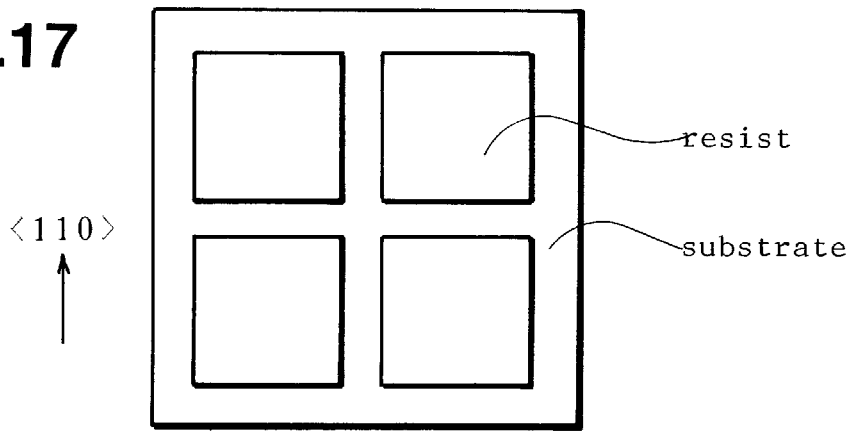
FIG. 17 is a partial plan view of 2×2 units of a resist coated diamond wafer.
Figure 18:
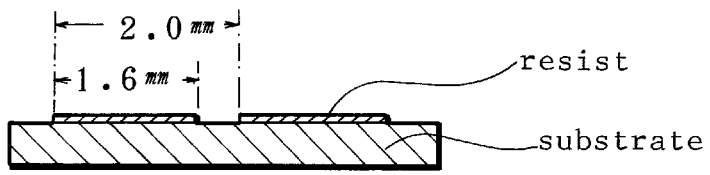
FIG. 18 is a partial front view of the same diamond wafer as FIG. 17.

Sample15: Periodic Inhemogeneous Embodiment, Single-Orientation & Random-Orientation A 2-inch (50 mm) Si (100) single crystal with a mirror surface is prepared as a substrate. A plenty of square resist films of 1.6 mm×1.6 mm are formed lengthwise and crosswise in a period of 2.0 mm×2.0 mm on the substrate. Then the substrate is bruised by sandblasting with diamond powder of average diameter of 50 μm, as denoted in FIG. 17 and FIG. 18. The lattice portions without the resists are scratched by the diamond powder. Then the resist films are eliminated from the substrate. Diamond is twice grown on the periodically bruised substrate by a microwave plasma CVD method. (First Step Synthesis) Diamond is grown at first under the conditions;

| | |
|---|---|
| Substrate Temperature | 900° C. |
| Synthesis Time | 10 Hours |
| Pressure | 120 Torr (16 kPa) |
| Total Gas Flux | 500 sccm |
| Gas Component | |
| hydrogen | 97.99 vol % |
| methane | 2.0 vol % |
| nitrogen | 0.01 vol % |
| Substrate Bias | 0 V |
| Diamond Height | 8 μm |

Lattice-like diamond walls of 8 μm height are piled periodically only on the scratched portions on the Si substrate. The crystallographical orientation is examined for the matrix diamond film by the SEM observation. All diamond grains are randomly-oriented. The diamond is totally polycrystalline at the scratched portions arranged in a lattice. (Second Step Synthesis) Further, diamond is again grown under the conditions;

| | |
|---|---|
| Substrate Temperature | 900° C. |
| Synthesis Time | 100 Hours |
| Pressure | 80 Torr (10 kPa) |
| Total Gas Flux | 500 sccm |
| Gas Component | |
| Early 5 minutes | |
| hydrogen | 98.0 vol % |
| methane | 2.0 vol % |
| Later 99 H 55 min | |
| hydrogen | 96.2 vol % |
| methane | 3.8 vol % |
| Substrate Bias | |
| Early 5 minutes | −150 V |
| Later 99 H 55 min | 0 V |
| Diamond Film Thickness | 180 μm |
| Distortion | −8 μm |

Figure 19:
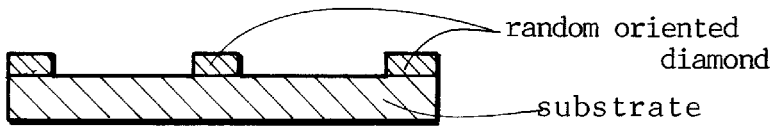
FIG. 19 is a sectional front view of the diamond wafer having random-oriented diamond films on the substrate.

A 180 μm thick diamond film is grown overall on the substrate. Diamond grains are all single-oriented in the film. The orientation of grains is identical to the orientation of the substrate. The sectional structure of the film is shown in FIG. 20. The latter-grown single-oriented diamond buries the former made random-oriented diamond walls. The random-oriented diamond is still further grown for a short time in the second step. Thus, the height of the random oriented diamond in FIG. 20 is higher than the random oriented diamond in FIG. 19. The distortion is −8 μm. The diamond film is polished by the same polishing machine. All the surface is polished into mirror smoothness without exfoliation. The lattice-shaped polycrystal prevents the diamond film from peeling. This is an evidence of the reinforcement of the periodically distributed random-orientation diamond polycrystals.

Sample16: Periodic Inhomogeneous Embodiment, Single-Orientation & Cavities

A 2-inch (50 mm) Si (100) single crystal with a mirror surface is prepared as a substrate. A parallel grooves are dug in a period of 1 mm×1 mm by a YAG laser. The individual groove has a width of 100 μm and a depth of 10 μm. The grooves are dug in order to forbid the growth of diamond on the grooves. Diamond is grown on the periodically grooved substrate by a microwave plasma CVD method under the conditions;

| | |
|---|---|
| Substrate Temperature | 900° C. |
| Synthesis Time | 100 Hours |
| Pressure | 60 Torr (8 kPa) |
| Total Gas Flux | 500 sccm |
| Gas Component | |
| Early 5 minutes | |
| hydrogen | 98.0 vol % |
| methane | 2.0 vol % |
| Later 99 H 55 min | |
| hydrogen | 96.2 vol % |
| methane | 3.8 vol % |
| Substrate Bias | |
| Early 5 minutes | −150 V |
| Later 99 H 55 min | 0 V |
| Diamond Film Thickness | 180 μm |
| Distortion | −32 μm |

Figure 21:
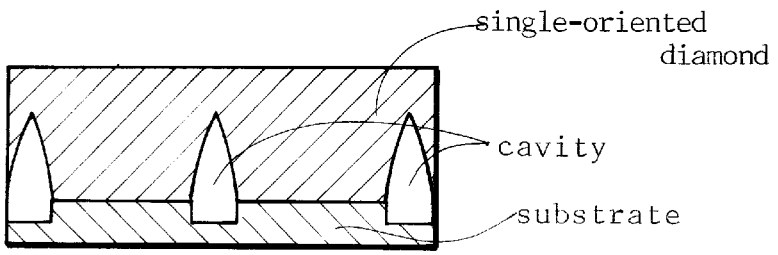
FIG. 21 is a sectional front view of the diamond wafer having periodically perforated cavities and a CVD-deposited single-oriented diamond film which conceals the cavities on the substrate.

A 180 μm thick diamond film is grown overall on the substrate. Diamond grains are all single-oriented in the film from the surface observation. The orientation of grains is identical to the orientation of the substrate. The sectional structure of the film is shown in FIG. 21. Since diamond is not deposited on the grooves, the spaces above the grooves are not filled with diamond. The diamond, however, buries the spaces in the meantime. Thus, plenty of cavities are left on the grooves. The cavities reinforce the interface between the diamond and the substrate.

The distortion is −32 μm. The diamond film is polished by the same polishing machine. All the surface is polished into mirror smoothness without exfoliation. The existence of the inner cavities prevents the diamond film from peeling. This is an evidence of the reinforcement of the periodically distributed cavities.

Sample17: Homogeneous Comparison Example, Single-Orientation

A 2-inch (50 mm) Si (100) single crystal with a mirror surface is prepared as a substrate. Without digging grooves, diamond is grown on the smooth substrate by a microwave plasma CVD method under the conditions;

| | |
|---|---|
| Substrate Temperature | 700° C. |
| Synthesis Time | 300 Hours |
| Pressure | 15 Torr (2 kPa) |
| Total Gas Flux | 500 sccm |
| Gas Component | |
| Early 5 minutes | |
| hydrogen | 98.00 vol % |
| methane | 2.0 vol % |
| Later 99 H 55 min | |
| hydrogen | 96.200 vol % |
| methane | 3.8 vol % |
| Substrate Bias | |
| Early 5 minutes | −180 V |
| Later 99 H 55 min | 0 V |
| Diamond Film Thickness | 150 μm |
| Distortion | −180 μm |

A 150 μm thick diamond film is grown overall on the substrate. Diamond grains are all single-oriented in the film from the surface observation. The orientation of grains is identical to the orientation of the substrate. The film is entirely homogeneous. The distortion is −180 μm.

The diamond film is polished by the same polishing machine. When about 20% of the diamond film has been whetted, the wafer is broken in half nearly along a center line. Furthermore, exfoliation occurs at the interface on about 15% of the mirror polished parts. This is a proof of the weak interface between a homogeneous diamond and a substrate.

Figure 31:
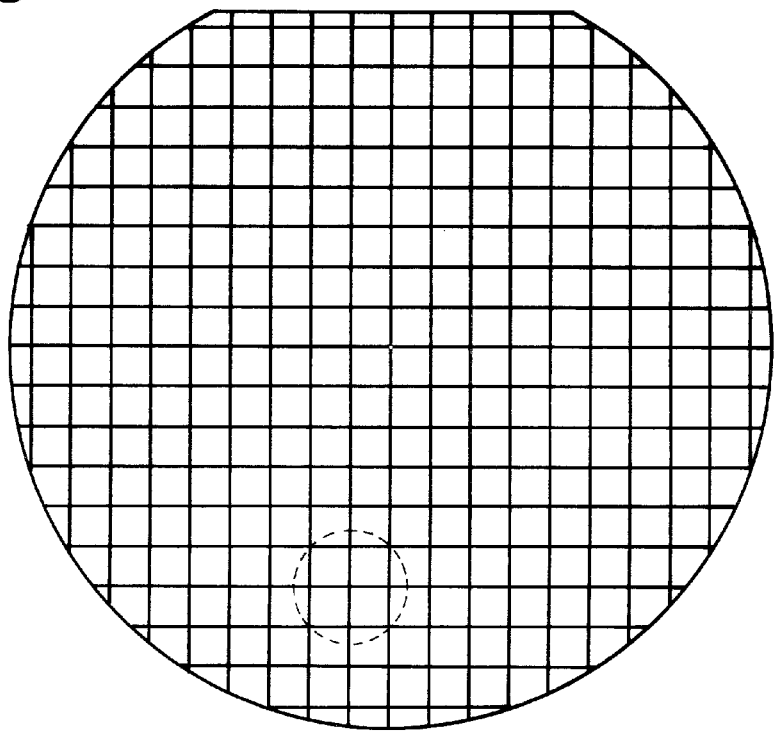
FIG. 31 is a plan view of a Si wafer selectively coated by square resist films.
Figure 32:
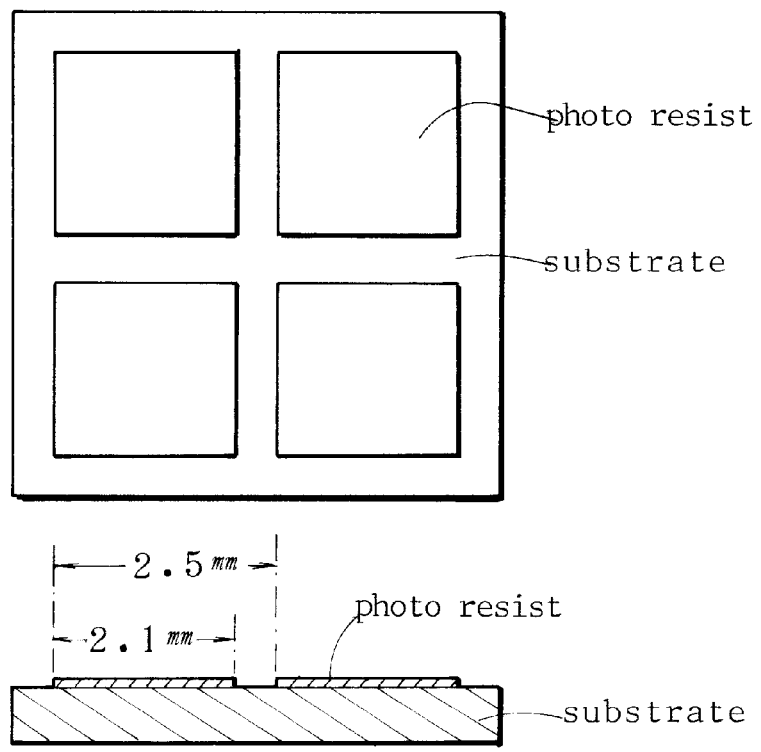
FIG. 32 is a partial plan view and a front view of 2×2 units of the wafer of FIG. 31.
Figure 33:
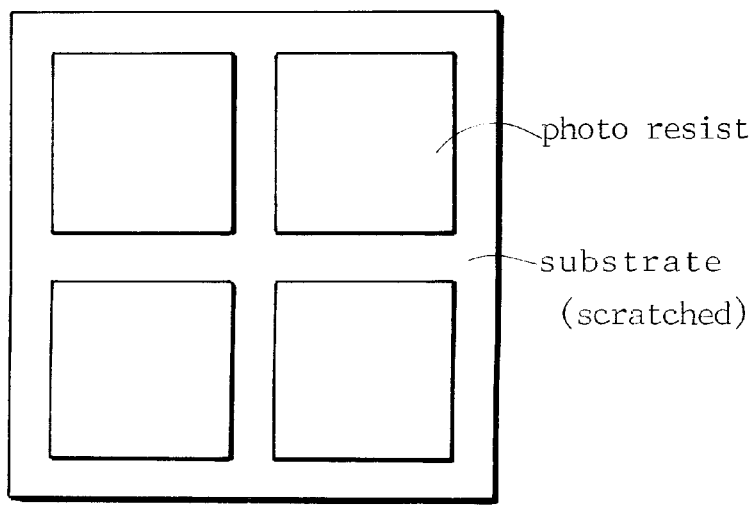
FIG. 33 is a plan view of the 2×2 part having scratched lattice portions of the substrate.

Sample 18: Emdodiment of a Making Mefest Field effect Transistors on a Diamond Wafer Reinforced by Amorphous Carbon MESFET (Metal Semiconductor Field Effect Transistor) is produced on a diamond wafer of this invention. A two-inch Si {100} single crystal is prepared for a substrate. Square resist layers of 2.1 mm×2.1 mm are produced in a lattice of a period of 2.5 mm×2.5 mm crosswise and lengthwise by photolithography, as shown in FIG. 31. FIG. 32 is an enlarged partial views (a plan view and a front view of 2×2 units on the wafer). The lattice-like portions without resists have 0.4 mm width. The wafer is scratched by diamond powder of average diameter of 100 μm. The lattice like portions are scratched by the treatment (FIG. 33). The resist is eliminated. The square parts are left unscratched and mirror smooth.

Amorphous carbon is grown on the Si wafer by the microwave plasma CVD method by the conditions;

| | |
|---|---|
| Substrate Temperature | 700° C. |
| Synthesis Time | 5 hours |
| Total Gas Flux | 500 sccm |
| Substrate Bias | 0 V |
| Gas | |
| Hydrogen | 90 vol % |
| methane | 10 vol % |
| Film thickness | 10 μm |

Then amorphous carbon coats only the lattice-like regions which have not been covered by the photoresists. Then a single-oriented diamond film is produced on the substrate by the same microwave plasma CVD apparatus under the conditions;

| | |
|---|---|
| Substrate Temperature | 900° C. |
| Synthesis Time | 30 hours |
| Total Gas Flux | 500 sccm |
| Substrate Bias | |
| early 5 min | −150 V |
| later 29 H 55 min | 0 V |
| Gas | |
| early 5 min | |
| Hydrogen | 98 vol % |
| methane | 2 vol % |
| later 29 H 55 min | |
| Hydrogen | 96.2 vol % |
| methane | 3.8 vol % |
| Film thickness | 35 μm |

Figure 34:
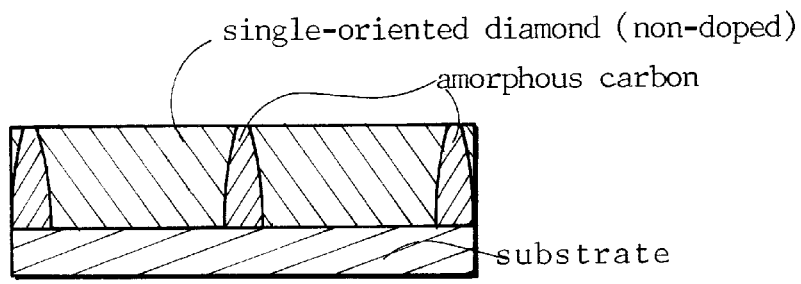
FIG. 34 is a sectional front view of the wafer having a substrate, amorphous carbon films and single-oriented diamond films deposited on the substrate.

A surface observation of the wafer reveals that the film is a assembly of diamond grains having similar orientations. Namely, the film is a set of the single-oriented diamond films and random-oriented amorphous carbon films. The distortion is −3 μm. The complex diamond film is rugged. Then the film is polished by the machine. The wafer can be polished uniformly into a mirror surface without exfoliation or chipping. FIG. 34 denotes a section of the mirror-polished wafer. Some parts of the amorphous carbon which form a lattice reveal on the surface.

Then a boron-doped diamond film is grown on the mirror wafer by the same microwave plasma CVD apparatus by the conditions;

| | |
|---|---|
| Substrate Temperature | 950° C. |
| Synthesis Time | 2 hours |
| Total Gas Flux | 500 sccm |
| Substrate Bias | 0 V |
| Gas | |
| Hydrogen | 99 vol % |
| methane | 1 vol % |
| diborane ($B_2H_6$) | 1 ppm |
| Thickness | 1 μm |

The p-type diamond film has about 1 μm thickness. The p-type layer grows epitaxially on the single-oriented film but grows random-orientedly on the random-oriented films.

Figure 35:
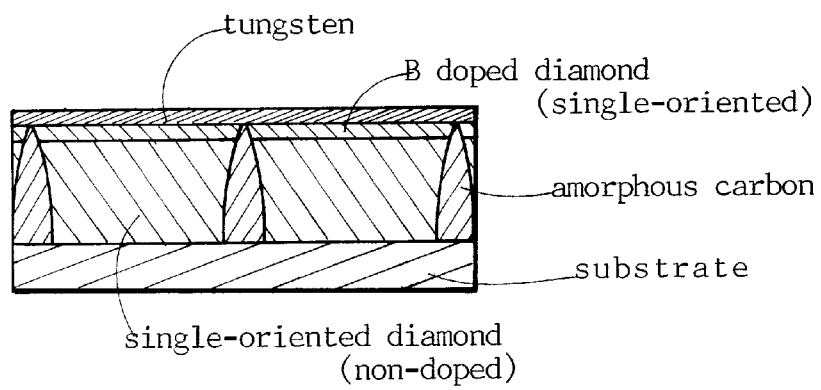
FIG. 35 is a sectional front view of the wafer having boron-doped diamond films deposited and a tungsten film evaporated on the sample shown in FIG. 34.
Figure 36:
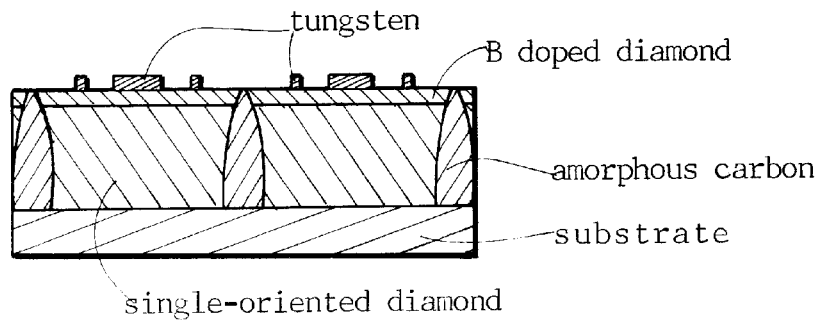
FIG. 36 is a sectional front view of the wafer having tungsten electrodes formed by the photolithography on the sample shown in FIG. 35.

A tungsten layer is deposited on the boron-doped diamond film by the electron beam evaporation method (FIG. 35). Selectively tungsten is eliminated by the photolithography. FIG. 36 indicates a partial section of the wafer at the step. The tungsten layers will be drains and sources of FETs. Then, non-doped diamond film is further grown on the partially tungsten coated wafer by the same microwave plasma CVD method by the conditions;

| | |
|---|---|
| Substrate Temperature | 950° C. |
| Synthesis Time | 3 hours |
| Total Gas Flux | 500 sccm |
| Substrate Bias | 0 V |
| Gas | |
| Hydrogen | 98.8 vol % |
| methane | 1.2 vol % |
| Film thickness | |
| on single oriented diamond | 2 μm |
| on tungsten | 0 μm |

Figure 37:
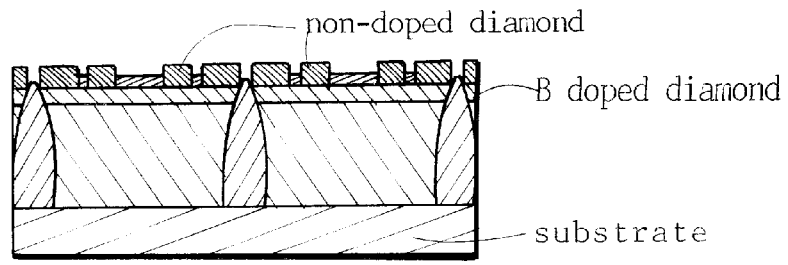
FIG. 37 is a sectional view of the wafer having non-dope diamond films further deposited on the wafer shown in FIG. 36.

Nothing is deposited on the tungsten films. Amorphous carbon is deposited on the amorphous carbon layers. Diamond is grown on the single-oriented diamond films. The non-doped diamond film has about a 2 μm thickness. FIG. 37 shows a partial section of the diamond deposited wafer.

Figure 38:
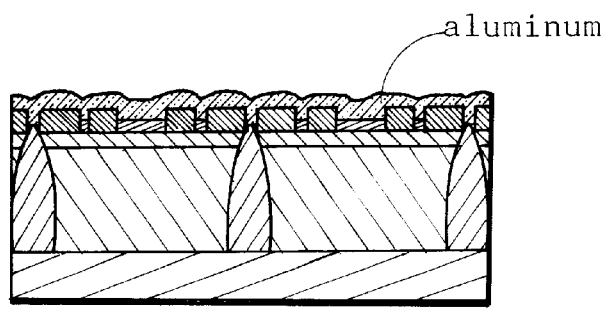
FIG. 38 is a sectional view of the wafer having an aluminum film evaporated further on the wafer indicated in FIG. 37.
Figure 39:
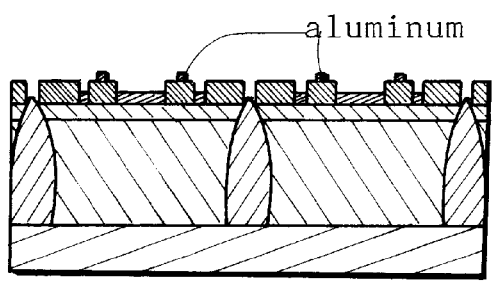
FIG. 39 is a sectional view of the wafer on which aluminum gate electrodes are fabricated on the gate regions of the FETs.
Figure 40:
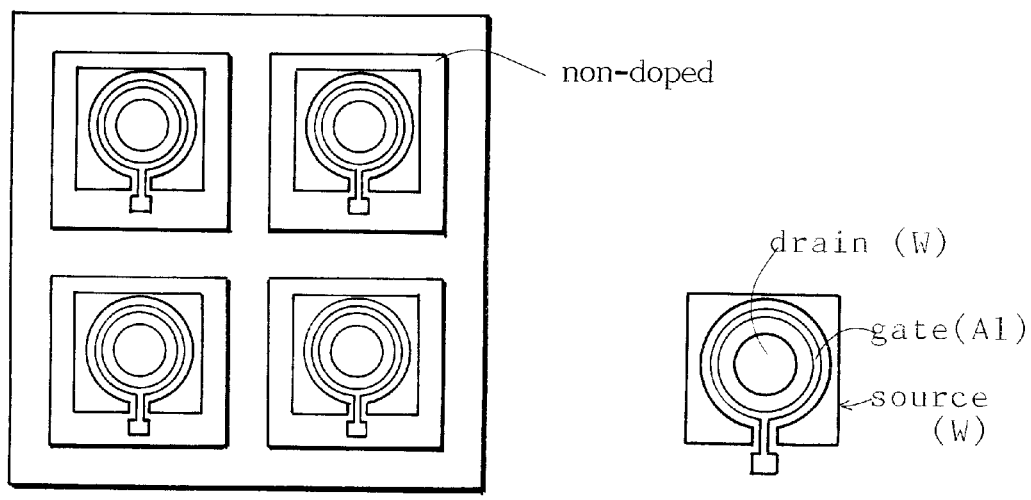
FIG. 40 is a plan view of the FETs having a drain, a source and a gate made on the wafer.

Aluminum is deposited on the wafer by the resistor heater evaporation method. FIG. 38 shows a partial section at the step. The aluminum is eliminated by the photolithography except the ring-shaped regions on the non-doped diamond layer. Then FETs are made by the steps, as shown in FIG. 39 and FIG. 40. In a unit, the peripheral square part coated by tungsten is a source. The middle aluminum ring is a gate and the central round coated with tungsten is a drain.

Individual FETs are divided lengthwise and crosswise by dicing the regions of the amorphous carbon by a blade with a cutting width of 200 μm. More than 300 FETs are obtained by the process. Almost all of the FETs are proved to be well-functioned by the electrical examination. This result exhibits the excellence of the function of the regularly planted amorphous carbon for preventing from exfoliating the diamond films. The high yield of making the FETs results from the high resistance against the peeling by the introduction of irregularity to the uniform diamond films.

What we claim is:

1. A wafer comprising;
   a single crystal substrate being made of a semiconductor, a metal or a non-diamond insulator;
   a diamond film being deposited on the substrate and having single-orientation parts in which more than 90% of diamond grains have orientations similar to the substrate with a deviation less than ten degrees and random-orientation parts in which diamond grains have randomly distributed orientations;
   an interface between the substrate and the diamond film and;
   a surface of the diamond film being polished to a roughness less than Rmax100 nm and Ra50 nm;
   wherein the single-orientation parts occupy more than 60% of the surface and the random-orientation parts occupy 0.1% to 50% of the whole area on a horizontal section taken in parallel to the interface in the vicinity of the interface.

2. A wafer as claimed in claim 1, wherein the wafer is substantially a circular disc with a diameter larger than 1 inch (25 mm) which is monotonously convex-distorted from a periphery to a center.

3. A wafer as claimed in claim 2, wherein the substrate is a (100) single crystal of a cubic monoelement semiconductor or a cubic compound semiconductor.

4. A wafer as claimed in claim 3, wherein an intermediate layer of cubic SiC is interposed between the substrate and the diamond film.

5. A wafer as claimed in claim 4, wherein the diamond film has a thickness between 2 μm and 1000 μm.

6. A wafer as claimed in claim 5, wherein a partial diamond region of at least a 1 μm thickness from the interface contains nitrogen atoms of a concentration ranging from 0.1 wtppm to 100 wtppm.

7. A wafer as claimed in claim 6, wherein single-oriented parts with an area more than 1 mm$^2$ in which more than 90% of diamond grains have similar orientations with a deviation less than ten degrees are periodically arranged in a horizontal section being parallel with the interface and being distanced by 1 μm to 10 μm from the interface and the single-oriented parts occupy more than 60% of the surface.

8. A wafer as claimed in claim 7, wherein single-oriented parts with an area more than 1 mm$^2$ in which more than 90% of diamond grains have similar orientations with a deviation less than ten degrees are periodically arranged in a horizontal section being parallel with the interface and being distanced by 1 μm to 10 μm from the interface, the single-oriented parts occupy more than 60% of the surface and the other parts than the single-oriented parts are random-oriented diamond.

9. A wafer comprising;
   a single crystal substrate being made of a semiconductor, a metal or a non-diamond insulator;
   a diamond film being deposited on the substrate and having single-orientation parts in which more than 90% of diamond grains have orientations similar to the substrate with a deviation less than ten degrees and cavities;
   an interface between the substrate and the diamond film and;
   a surface of the diamond film being polished to a roughness less than Rmax100 nm and Ra50 nm;
   wherein the single-orientation parts occupy more than 60% of the surface and the cavities occupy 0.1% to 50% of the whole area on a horizontal section taken in parallel to the interface in the vicinity of the the interface.

10. A wafer as claimed in claim 9, wherein the wafer is substantially a circular disc with a diameter larger than 1 inch (25 mm) which is monotonously convex-distorted from a periphery to a center.

11. A wafer as claimed in claim 10, wherein the substrate is a (100) single crystal of a cubic monoelement semiconductor or a cubic compound semiconductor.

12. A wafer as claimed in claim 11, wherein an intermediate layer of cubic SiC is interposed between the substrate and the diamond film.

13. A wafer as claimed in claim 12, wherein the diamond film has a thickness between 2 μm and 1000 μm.

14. A wafer as claimed in claim 13, wherein a partial diamond region of at least a 1 μm thickness from the interface contains nitrogen atoms of a concentration ranging from 0.1 wtppm to 100 wtppm.

15. A wafer as claimed in claim 13, wherein single-oriented parts with an area more than 1 mm$^2$ in which more than 90% of diamond grains have similar orientations with a deviation less than ten degrees are periodically arranged in a horizontal section being parallel with the interface and being distanced by 1 μm to 10 μm from the interface, the single-oriented parts occupy more than 60% of the surface and the other parts than the single-oriented parts are cavities.

16. A wafer as claimed in claim 8, wherein the periodic structure of the single-oriented parts has a direction-specifying vector, and the vector is parallel with a <111> direction of the diamond of the single-oriented parts.

17. A wafer as claimed in claim 15, wherein the periodic structure of the single-oriented parts has a direction-specifying vector and the vector is parallel with a <111> direction of the diamond of the single-oriented parts.

18. A wafer comprising;
a single crystal substrate being made of a semiconductor, a metal or a non-diamond insulator;
a diamond film being deposited on the substrate and having single-orientation parts in which more than 90% of diamond grains have orientations similar to the substrate with a deviation less than ten degrees and random-oriented parts in which diamond grains have randomly distributed directions;
an interface between the substrate and the diamond film and;
a surface of the diamond film being polished to a roughness less than Rmax100 nm and Ra50 nm;
wherein the single-orientation parts occupy more than 60% of the surface and the random-oriented parts exist at the periphery of the wafer and occupy 1% to 50% of the whole area on a horizontal section taken in parallel to the interface in the vicinity of the the interface.

19. A wafer comprising;
a single crystal substrate being made of a semiconductor, a metal or a non-diamond insulator;
a diamond film being deposited on the substrate and having single-orientation parts in which more than 90% of diamond grains have orientations similar to the substrate with a deviation less than ten degrees and non-diamond carbon parts in which amorphous carbon or graphitic carbon makes films;
an interface between the substrate and the diamond film and;
a surface of the diamond film being polished to a roughness less than Rmax100 nm and Ra50 nm;
wherein the single-orientation parts occupy more than 60% of the surface and the non-diamond carbon parts occupy 0.1% to 50% of the whole area on a horizontal section taken in parallel to the interface in the vicinity of the the interface.

20. A wafer as claimed in claim 19, wherein the wafer is substantially a circular disc with a diameter larger than 1 inch (25 mm) which is monotonously convex-distorted from a periphery to a center.

21. A wafer as claimed in claim 20, wherein the substrate is a (100) single crystal of a cubic monoelement semiconductor or a cubic compound semiconductor.

22. A wafer as claimed in claim 21, wherein an intermediate layer of cubic SiC is interposed between the substrate and the diamond film.

23. A wafer as claimed in claim 22, wherein the diamond film has a thickness between 2 $\mu$m and 1000 $\mu$m.

24. A wafer as claimed in claim 23, wherein a partial diamond region of at least a 1 $\mu$m thickness from the interface contains nitrogen atoms of a concentration ranging from 0.1 wtppm to 100 wtppm.

25. A wafer as claimed in claim 24, wherein single-oriented parts with an area more than 1 mm$^2$ in which more than 90% of diamond grains have similar orientations with a deviation less than ten degrees are periodically arranged in a horizontal section being parallel with the interface and being distanced by 1 $\mu$m to 10 $\mu$m from the interface and the single-oriented parts occupy more than 60% of the surface.

26. A wafer as claimed in claim 25, wherein the other parts than the single-oriented parts are non-diamond carbon ingredients.

27. A wafer as claimed in claim 26, wherein the periodic structure of the single-oriented parts has a direction-specifying vector, and the vector is parallel with a <111> direction of the diamond of the single-oriented parts.

28. A wafer comprising;
a freestanding diamond film having single-orientation parts in which more than 90% of diamond grains have orientations similar to each other with a deviation less than ten degrees and random-oriented parts in which diamond grains have randomly distributed direction and;
free surfaces of the diamond film being polished to a roughness less than Rmax100 nm and Ra50 nm;
wherein the single-orientation parts are periodically arranged in a horizontal section being parallel with the surface and the other parts than the single-oriented parts are randomly-oriented parts.

29. A wafer as claimed in claim 28, wherein the single-orientation parts of the freestanding diamond film have a (100) plane as a free surface.

30. A wafer as claimed in claim 28, wherein the single-orientation parts of the freestanding diamond film have a (111) plane as a free surface.

31. A wafer as claimed in claim 28, wherein the single-orientation parts of the freestanding diamond film have a (110) plane as a free surface.

32. A method of producing a wafer comprising the steps of;
preparing a non-diamond single crystal substrate having two surfaces;
scratching parts of the surface;
making scratched parts and unscratched parts on the surface;
growing random-oriented diamond islands only on the scratched parts by a vapor phase method using a material gas including at least hydrogen gas and a hydrocarbon gas;
growing single-oriented diamond films on the unscratched parts;
sticking the substrate to a holder which can incline to a holder shaft;
pushing the diamond film on a turn-table coated with diamond powder of a polishing machine and;
polishing the convex distorted diamond film till a roughness less than Rmax100 nm and Ra50 nm by inclining the holder to the turn-table.

33. A method as claimed in claim 32, wherein the non-diamond single crystal is a Si single crystal, a Cu single crystal, a Ni single crystal, a Ni—Cu alloy single crystal, a GaAs single crystal or a SiC single crystal.

34. A method as claimed in claim 33, wherein the non-diamond substrate has an inherent distortion height $\Delta H$ between $-2$ $\mu$m and $-150$ $\mu$m.

35. A method as claimed in claim 34, wherein the film is polished into a roughness less than Rmax50 nm and Ra20 nm.

36. A method as claimed in claim 32, wherein the substrate has a central part, an intermediate part and a peripheral part and only the peripheral part is scratched.

37. A method as claimed in claim 36, wherein the random-oriented diamond is grown on the peripheral part and the other parts are covered with single-oriented diamond.

38. A method as claimed in claim 32, wherein the substrate is periodically scratched by a scratching process of covering the substrate with a mask depicted with periodic patterns, sandblasting the masked substrate and eliminating the mask.

39. A method as claimed in claim 38, wherein the mask patterns are given by photoresist films.

40. A method as claimed in claim 39, wherein square resist films are formed periodically lengthwise and crosswise on the substrate, and spacings between neighboring squares are bruised by the scratching process.

41. A method as claimed in claim 40, wherein the directions of the spacings are parallel with the cleavage planes {111} of the diamond film crystal.

42. A method as claimed in claim 41, wherein the period of the squares is equal to the side of an IC devices which will be fabricated on the wafer.

43. A method of producing a wafer comprising the steps of;

preparing a non-diamond single crystal substrate having two surfaces, digging grooves or holes;

making cavity parts defined by the grooves or holes and flat parts on the surface;

growing single-oriented diamond films orientation-aligning to the substrate only on the flat parts by a vapor phase epitaxy method using a material gas including at least hydrogen gas and a hydrocarbon gas;

making holes on the cavity parts by preventing diamond from growing on the cavity parts;

sticking the substrate to a holder which can incline to a holder shaft;

pushing the diamond film on a turn-table coated with diamond powder of a polishing machine and;

polishing the convex distorted diamond film till a roughness less than Rmax100 nm and Ra50 nm by inclining the holder to the turn-table.

44. A method as claimed in claim 43, wherein the diamond film is further polished to a roughness less than Rmax50 nm and Ra20 nm.

45. A method as claimed in claim 44, wherein the grooves or holes are formed periodically lengthwise and crosswise.

46. A method as claimed in claim 45, wherein the grooves or holes are dug by a YAG laser or an excimer laser.

47. A method of producing a wafer comprising the steps of;

preparing a non-diamond single crystal substrate having two surfaces;

scratching parts of the surface;

making scratched areas and unscratched areas on the surface;

growing random-oriented diamond films only on the scratched areas by a vapor phase deposition method using a material gas including at least hydrogen gas and a hydrocarbon gas;

growing single-oriented diamond films on the unscratched parts;

sticking the substrate to a holder which can incline to a holder shaft;

pushing the diamond film on a turn-table coated with diamond powder of a polishing machine;

polishing the convex distorted diamond film till a roughness less than Rmax100 nm and Ra50 nm by inclining the holder to the turn-table;

eliminating the substrate and;

obtaining a freestanding diamond wafer.

48. A method as claimed in claim 47, wherein the substrate is eliminated by solving it chemically.

49. A method as claimed in claim 48, wherein the substrate is eliminated by polishing it physically.

50. A method of producing a wafer comprising the steps of;

preparing a non-diamond single crystal substrate having two surfaces;

scratching parts of the surface;

covering some parts on the substrate with photoresist films;

sandblasting the substrate by diamond powder; making scratched parts and unscratched parts on the substrate;

growing non-diamond carbon films only on the scratched parts by a vapor phase deposition method using a material gas including at least hydrogen gas and a hydrocarbon gas;

growing single-oriented diamond films on the unscratched parts;

sticking the substrate to a holder which can incline to a holder shaft;

pushing the diamond film on a turn-table coated with diamond powder of a polishing machine and;

polishing the convex distorted diamond film till a roughness less than Rmax100 nm and Ra50 nm by inclining the holder to the turn-table.

51. A method as claimed in claim 50, wherein the non-diamond single crystal is a Si single crystal, a Cu single crystal, a Ni single crystal, a Ni—Cu single crystal, a GaAs single crystal or a SiC single crystal.

52. A method as claimed in claim 51, wherein the non-diamond substrate has an inherent distortion height $\Delta H$ between $-2\ \mu m$ and $-150\ \mu m$.

53. A method as claimed in claim 52, wherein the film is polished into a roughness less than Rmax50 nm and Ra20 nm.

54. A method as claimed in claim 53, wherein the substrate has a central part, an intermediate part and a peripheral part and only the peripheral part is scratched.

55. A method as claimed in claim 53, wherein the non-diamond carbon films are amorphous carbon films.

56. A method as claimed in claim 53, wherein the non-diamond carbon films are graphitic carbon.

57. A method as claimed in claim 53, wherein the substrate is periodically scratched by a scratching process of covering the substrate with a mask depicted with periodic patterns, sandblasting the masked substrate and eliminating the mask.

* * * * *